(12) United States Patent
Wu et al.

(10) Patent No.: US 11,843,028 B2
(45) Date of Patent: *Dec. 12, 2023

(54) ISOLATION FEATURES AND METHODS OF FABRICATING THE SAME

(71) Applicant: Taiwan Semiconductor Manufacturing Co., Ltd., Hsinchu (TW)

(72) Inventors: I-Wen Wu, Hsinchu (TW); Fu-Kai Yang, Hsinchu (TW); Chen-Ming B. Lee, Taoyuan County (TW); Mei-Yun Wang, Hsin-Chu (TW); Jr-Hung Li, Hsinchu County (TW); Bo-Cyuan Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 66 days.

This patent is subject to a terminal disclaimer.

(21) Appl. No.: 17/322,087

(22) Filed: May 17, 2021

(65) Prior Publication Data

US 2021/0273049 A1  Sep. 2, 2021

Related U.S. Application Data

(60) Continuation of application No. 16/704,138, filed on Dec. 5, 2019, now Pat. No. 11,239,309, which is a
(Continued)

(51) Int. Cl.
*H01L 29/06* (2006.01)
*H01L 27/088* (2006.01)
(Continued)

(52) U.S. Cl.
CPC ...... *H01L 29/0649* (2013.01); *H01L 21/0217* (2013.01); *H01L 21/0228* (2013.01);
(Continued)

(58) Field of Classification Search
None
See application file for complete search history.

(56) References Cited

U.S. PATENT DOCUMENTS 6,071,830 A   6/2000 Matsuzawa et al.
9,105,490 B2  8/2015 Wang et al.
(Continued)

*Primary Examiner* — Erik Kielin
(74) *Attorney, Agent, or Firm* — HAYNES AND BOONE, LLP

(57) ABSTRACT

Semiconductor devices and methods of fabricating semiconductor devices are provided. The present disclosure provides a semiconductor device that includes a first fin structure and a second fin structure each extending from a substrate; a first gate segment over the first fin structure and a second gate segment over the second fin structure; a first isolation feature separating the first and second gate segments; a first source/drain (S/D) feature over the first fin structure and adjacent to the first gate segment; a second S/D feature over the second fin structure and adjacent to the second gate segment; and a second isolation feature also disposed in the trench. The first and second S/D features are separated by the second isolation feature, and a composition of the second isolation feature is different from a composition of the first isolation feature.

20 Claims, 16 Drawing Sheets

Related U.S. Application Data division of application No. 15/905,882, filed on Feb. 27, 2018, now Pat. No. 10,504,990.

(60) Provisional application No. 62/589,136, filed on Nov. 21, 2017.

(51) Int. Cl.
| | |
|---|---|
| *H01L 29/78* | (2006.01) |
| *H01L 21/8234* | (2006.01) |
| *H01L 21/3105* | (2006.01) |
| *H01L 21/02* | (2006.01) |
| *H01L 21/762* | (2006.01) |
| *H01L 21/32* | (2006.01) |

(52) U.S. Cl.
CPC .... *H01L 21/0234* (2013.01); *H01L 21/02164* (2013.01); *H01L 21/02167* (2013.01); *H01L 21/02274* (2013.01); *H01L 21/02337* (2013.01); *H01L 21/02359* (2013.01); *H01L 21/3105* (2013.01); *H01L 21/31053* (2013.01); *H01L 21/76224* (2013.01); *H01L 21/823431* (2013.01); *H01L 21/823481* (2013.01); *H01L 27/0886* (2013.01); *H01L 29/7855* (2013.01); *H01L 21/32* (2013.01); *H01L 21/823437* (2013.01)

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Tuang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 2014/0073093 | A1 | 3/2014 | Farmer et al. |
| 2015/0200133 | A1 | 7/2015 | Chou et al. |
| 2015/0287811 | A1* | 10/2015 | Ramkumar ....... H01L 29/42348 438/287 |
| 2015/0371846 | A1 | 12/2015 | Chan |
| 2016/0056181 | A1 | 2/2016 | Anderson et al. |
| 2016/0093485 | A1 | 3/2016 | Kobayashi et al. |
| 2016/0247728 | A1 | 8/2016 | You et al. |
| 2016/0379982 | A1 | 12/2016 | You |
| 2018/0138092 | A1* | 5/2018 | Lee ....... H01L 29/785 |
| 2018/0261514 | A1 | 9/2018 | Xie et al. |
| 2018/0315821 | A1 | 11/2018 | Xie |
| 2018/0337037 | A1 | 11/2018 | Bouche et al. |
| 2019/0157387 | A1 | 5/2019 | Wu et al. |

\* cited by examiner

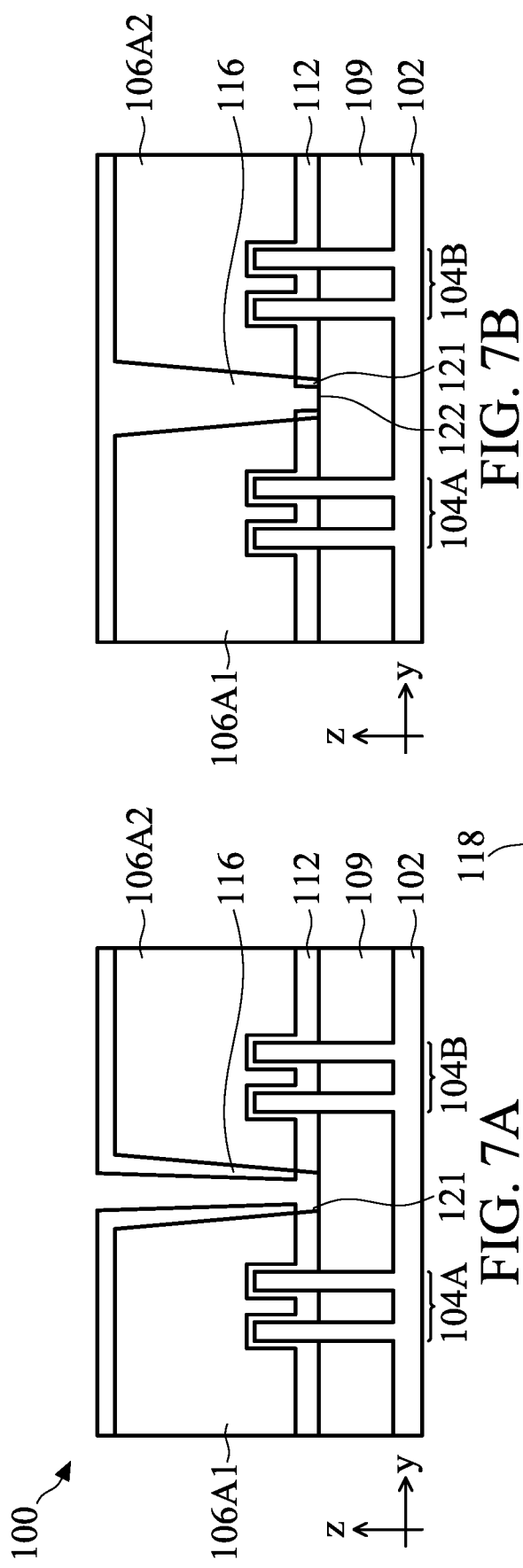

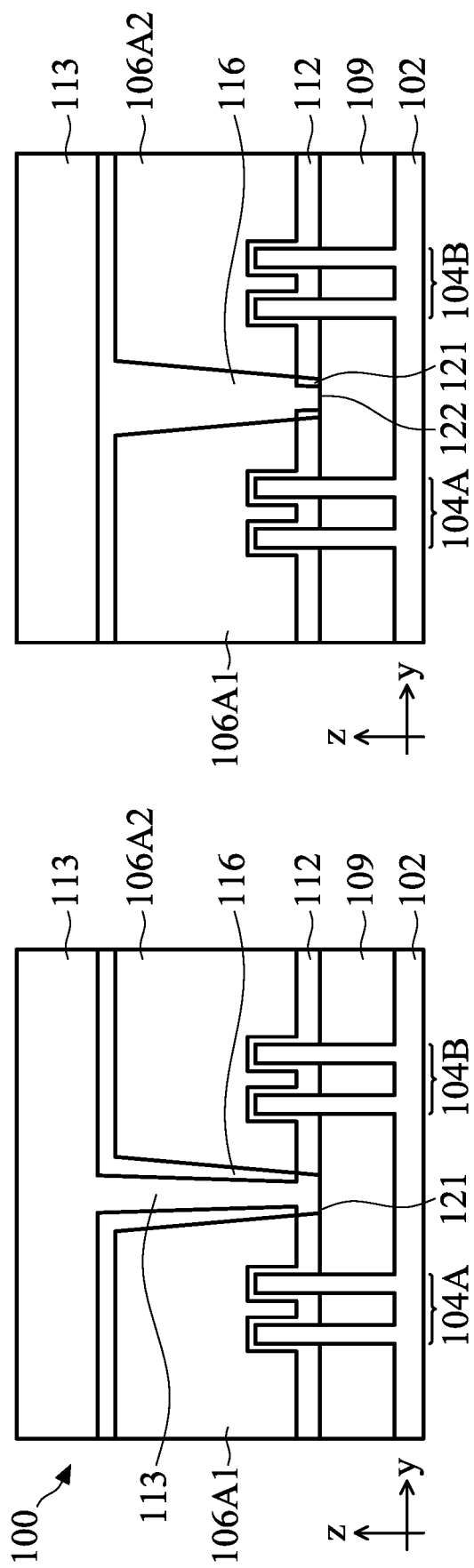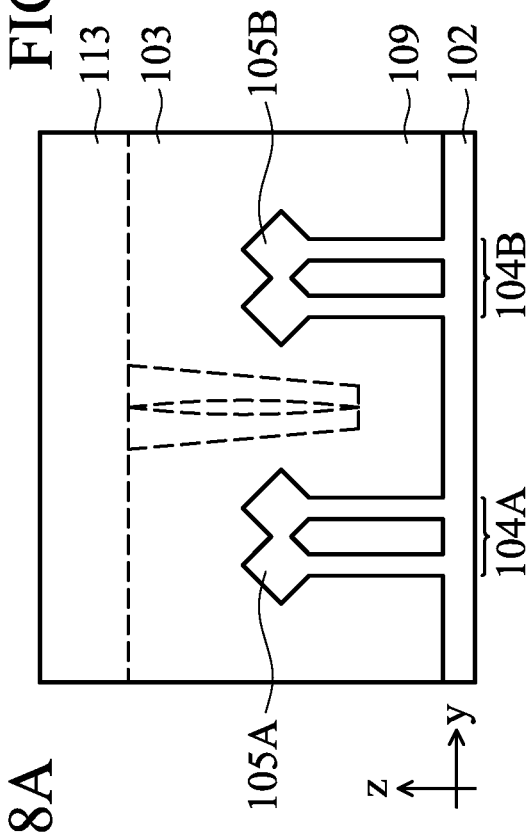

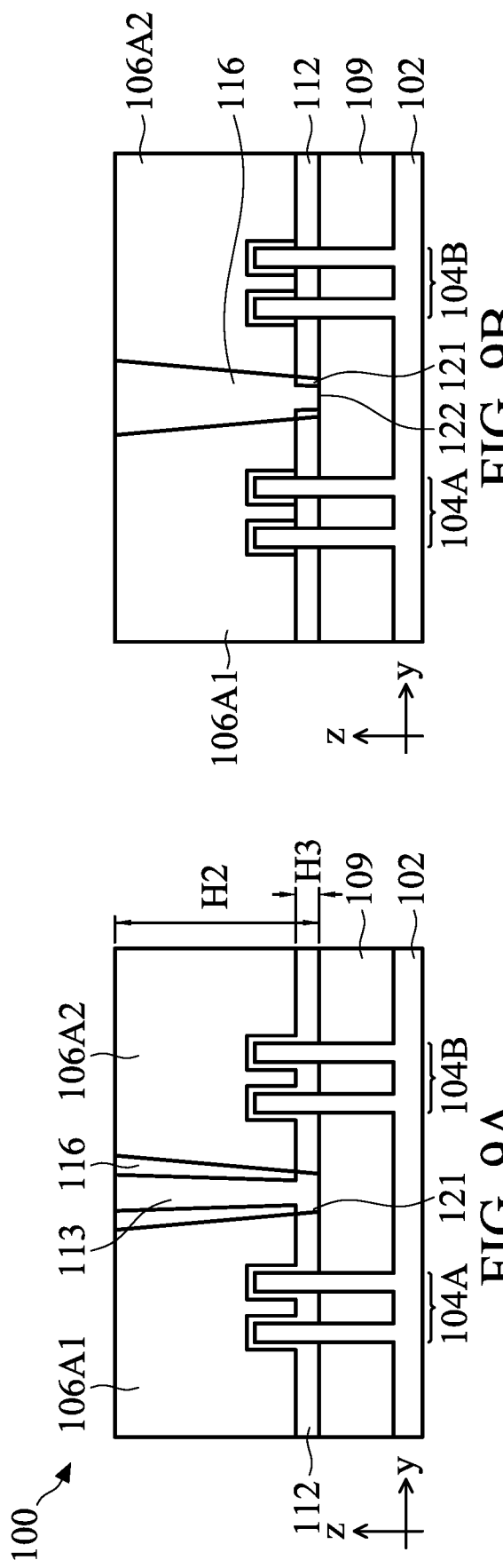

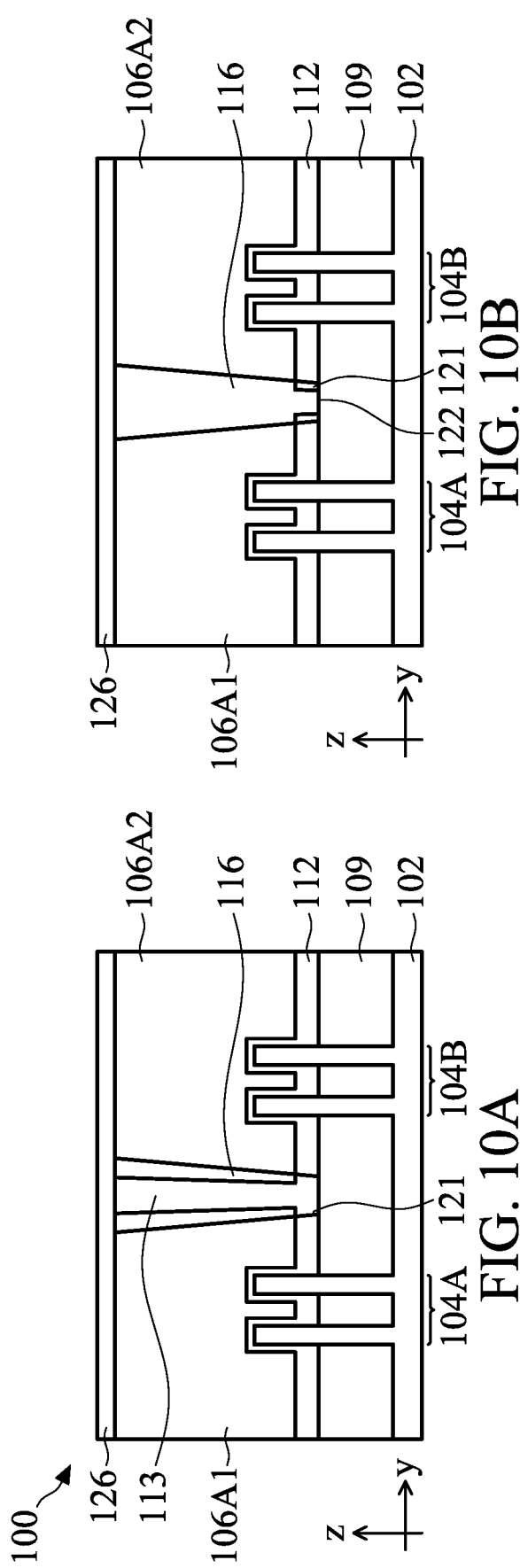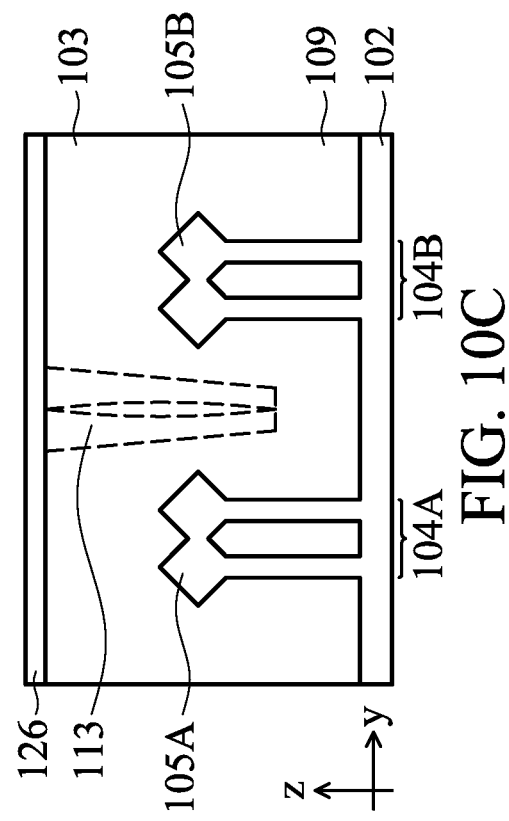

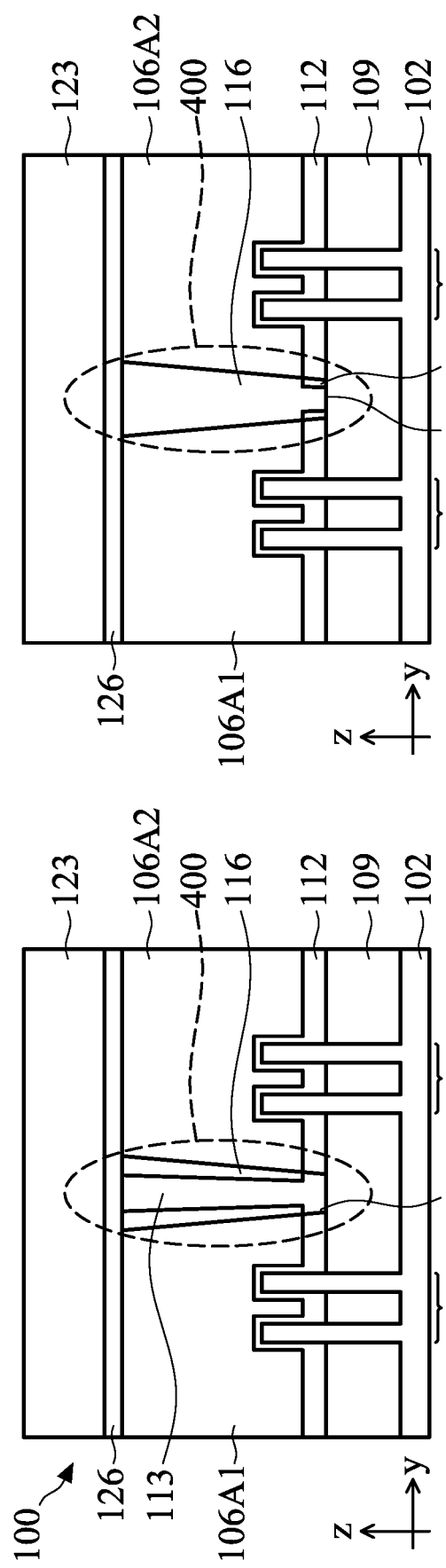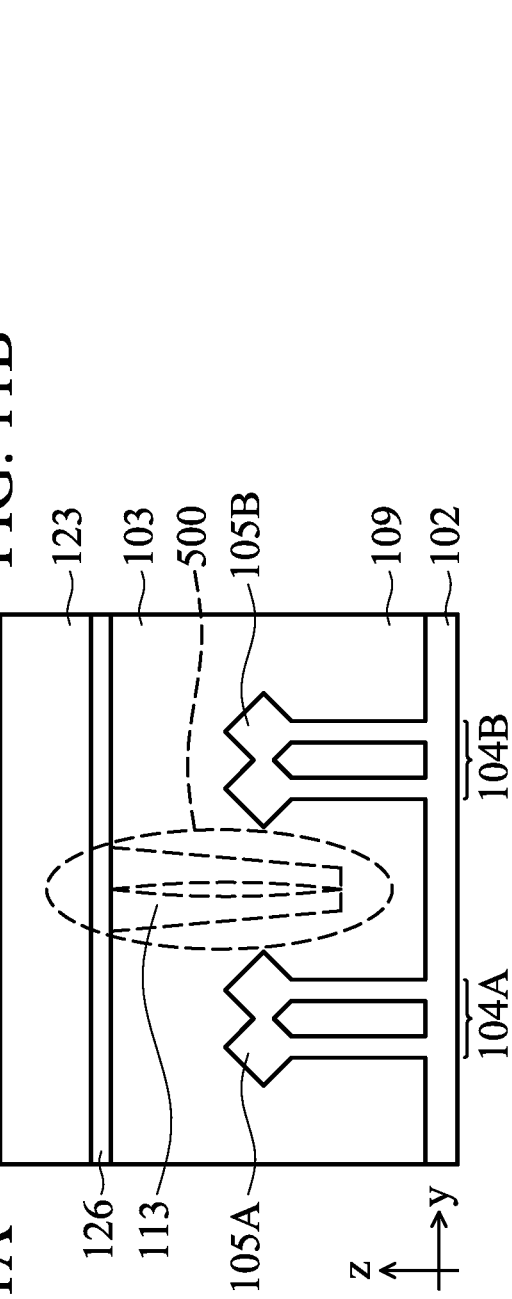
FIG. 11A
FIG. 11B
FIG. 11C

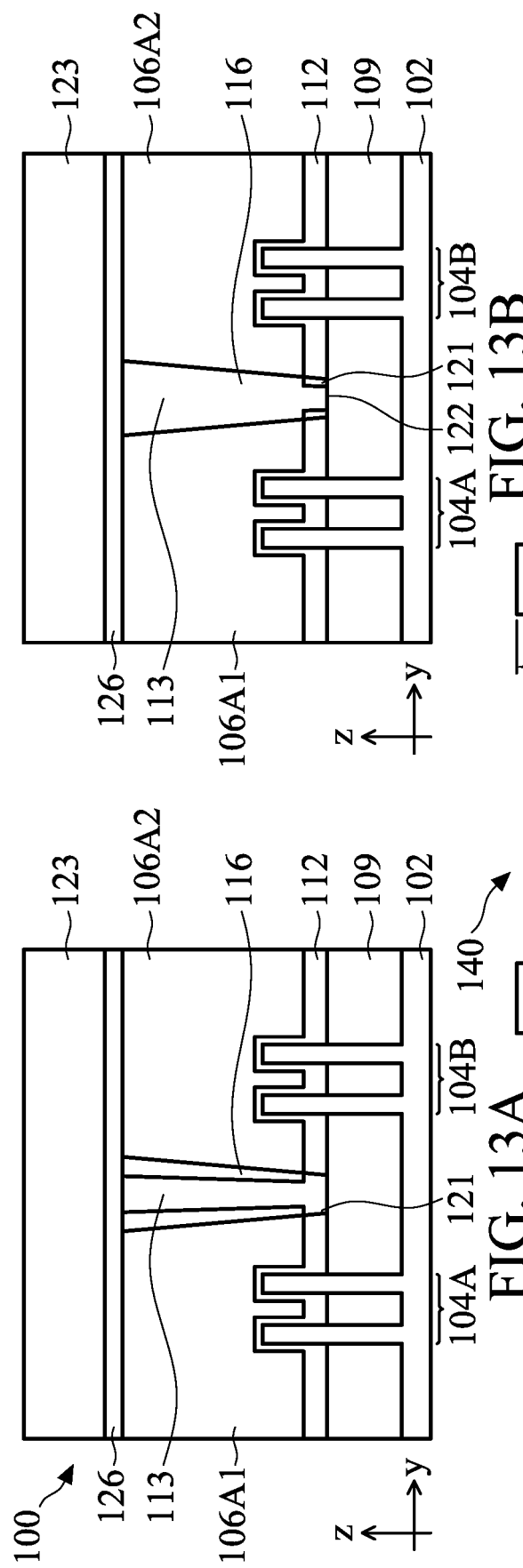
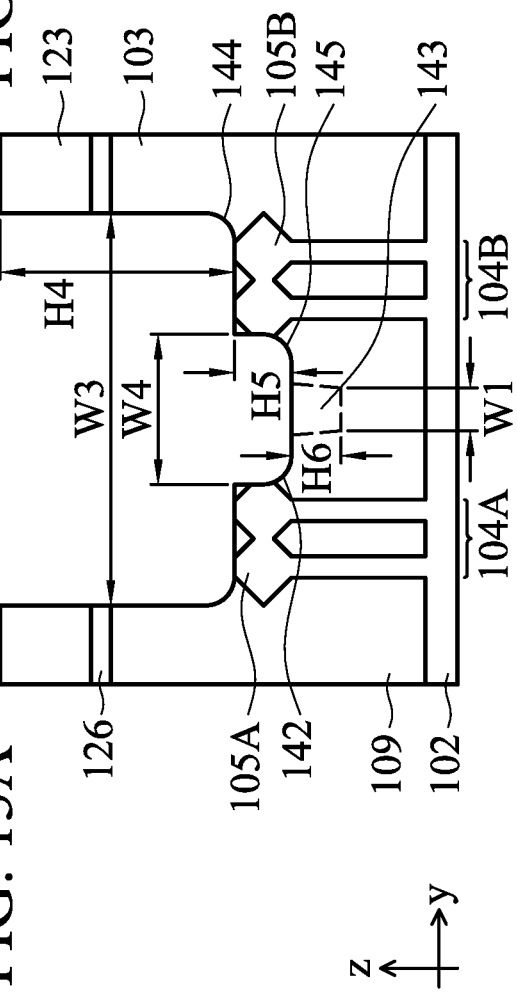
FIG. 13A
FIG. 13B
FIG. 13C

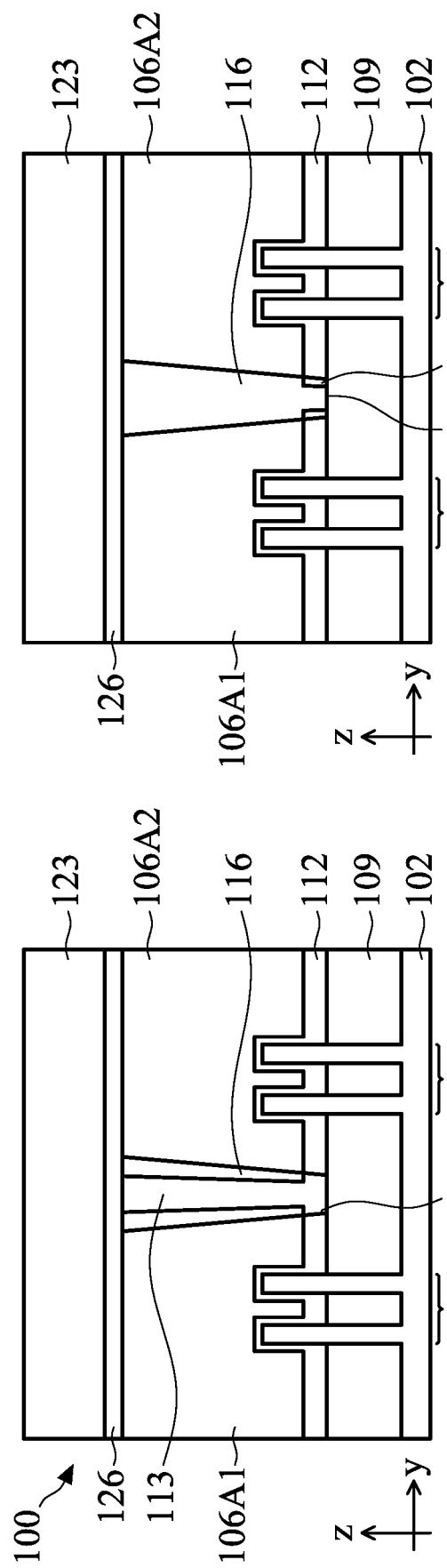
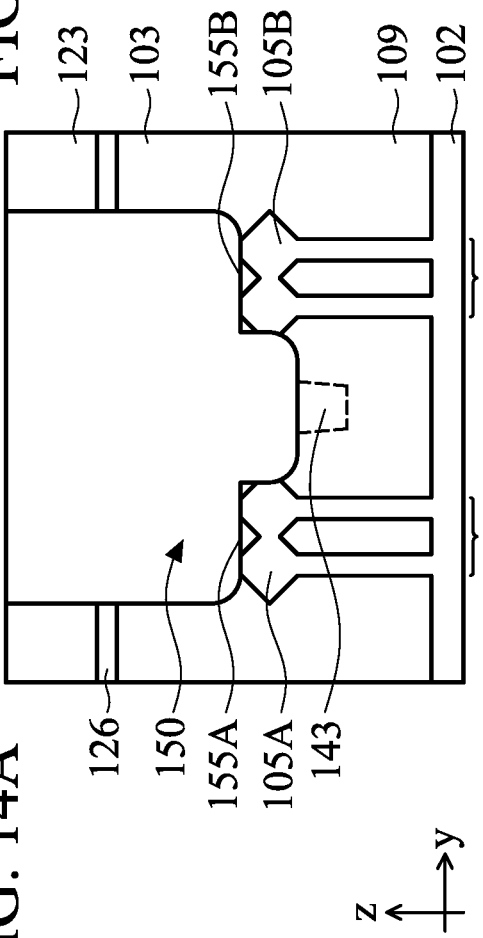
FIG. 14A
FIG. 14B
FIG. 14C

ISOLATION FEATURES AND METHODS OF FABRICATING THE SAME

PRIORITY DATA

The present application is a continuation application of U.S. application Ser. No. 16/704,138, filed on Dec. 15, 2019, which is a divisional application of U.S. application Ser. No. 15/905,882, filed Feb. 27, 2018, which claims priority to Provisional Patent Application Ser. No. 62/589,136, filed on Nov. 21, 2017, entitled "ISOLATION FEATURES AND METHODS OF FABRICATING THE SAME," each of which is herein incorporated by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. In addition, metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include a metal layer deposition followed by a subsequent metal layer cut process (or metal gate cut process). The metal layer cut process sometimes forms a trench that not only dissects the metal gate, but also goes through an inter-layer dielectric (ILD) layer near the source/drain (S/D) features. A dielectric material may be subsequently filled into this trench. However, existing trench-filling material and method have some limitations. For example, the trench-filling material may have different etch selectivity than the ILD layer, which may sometimes cause hillocks in the S/D contact landing area. These hillocks may increase contact resistance of the S/D contact and reduce yield.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A, 5A, 6A, 7A, 7B, 8A, 8B, 9A, 9B, 10A, 10B, 11A, 11B, 13A, 13B, 14A, and 14B show cross-sectional views of a metal gate structure along a plane substantially parallel to a plane defined by section AA' of FIG. 3, and fabricated according to an embodiment of the method of FIGS. 1A and 1B;

FIGS. 4B, 5B, 6B, 7C, 8C, 9C, 10C, 11C, 13C, and 14C show cross-sectional views of a S/D contact landing area along a plane substantially parallel to a plane defined by section BB' of FIG. 3, and fabricated according to an embodiment of the method of FIGS. 1A and 1B;

DETAILED DESCRIPTION

Figure 1A:
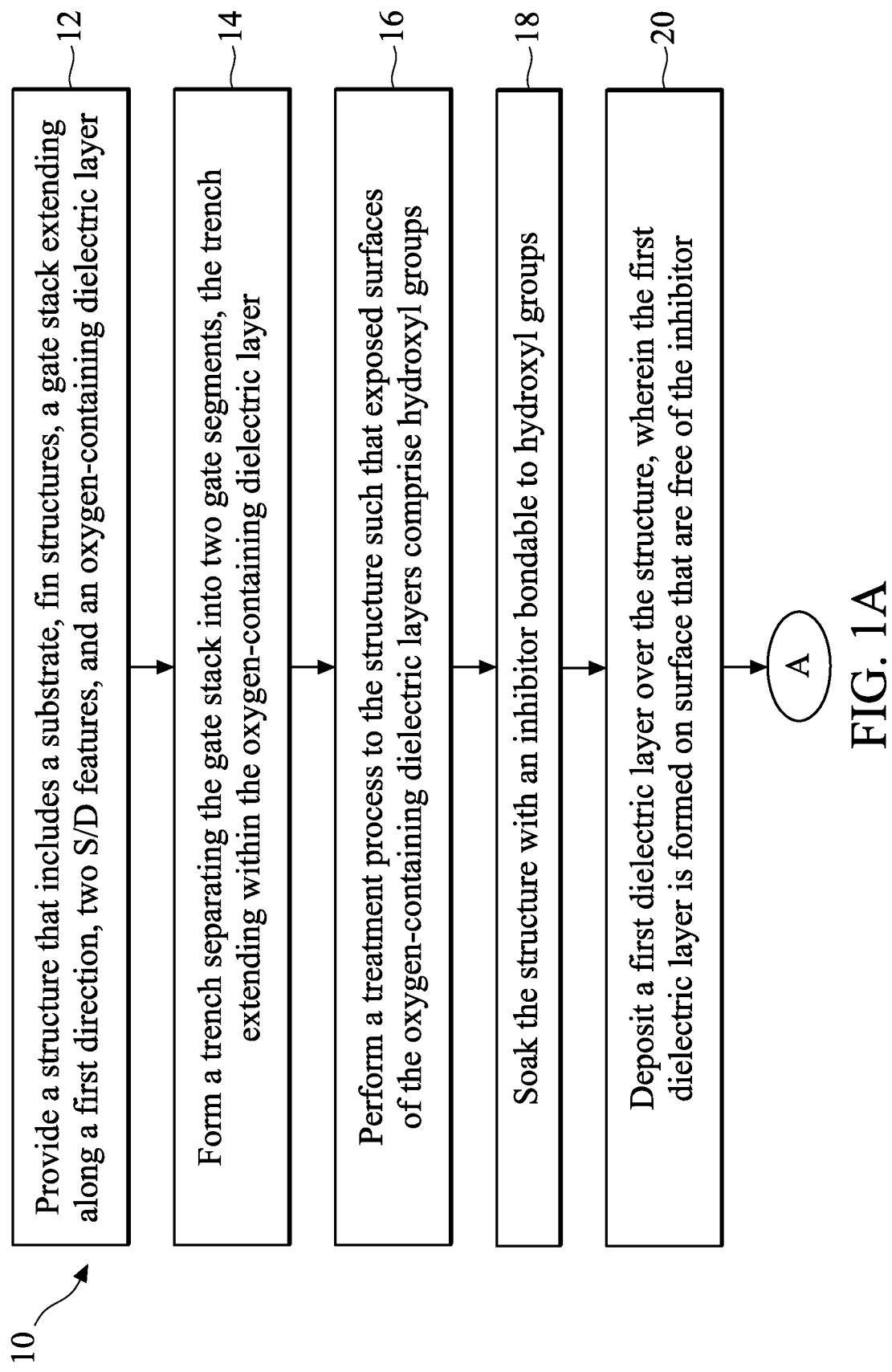
FIGS. 1A and 1B depict a flow chart of a method of fabricating a semiconductor device, according to one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill in the art may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices. In other embodiments, a planar device may be fabricated using one or more of the structures or methods discussed herein.

It is also noted that the illustrated Figures are exemplary of portions of a device formed on a substrate, as such, in some examples two fins are illustrated, in others additional fins are illustrated, in some examples two gates are illustrated, in others a single gate or additional gates are illustrated. As understood by one of ordinary skill in the art, a plurality of gates and fins are typically present in a semiconductor device and thus, the quantity of the gates or fins illustrated in the figures is for reference only and not intended to be limiting in its application.

The present application is generally related to isolation features and related methods. In particular, the present disclosure is directed to isolation features formed in a trench resulted from a metal gate cut process. Metal gate electrodes have been introduced as a replacement to polysilicon gate electrodes. Metal gate electrodes provide a number of advantages over polysilicon gate electrodes such as avoidance of the polysilicon depletion effect, work-function tuning by selection of appropriate gate metal(s), as well as other benefits. By way of example, a metal gate electrode fabrication process may include metal layer(s) deposition. Having formed metal gates extending across regions of the substrate, it may be necessary to "cut" or separate certain metal gate lines into segments isolated from one another to provide the transistor-level functionality required by the design. Thus, the formation of the metal gate electrode may be followed by a subsequent metal gate cut process. The metal gate cut process creates a trench that not only dissects a metal gate into two segments but also goes through ILD adjacent to the S/D features. To prevent oxidation of the metal gate electrode due to oxygen diffusion, an oxygen-free dielectric material, such as silicon nitride and silicon carbide nitride, is deposited in the trench to form an isolation feature.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, isolation features and related structures are provided. At least some embodiments of the present disclosure may be used to form different isolation features in the trench between newly cut metal segments of the metal gate structure and within the ILD adjacent to the S/D features. For example, when the S/D features and adjacent ILD are subsequently recessed to prepare for the formation of S/D contacts, the oxygen-free dielectric isolation feature in the ILD experiences an etching rate slower than that of the ILD, resulting in oxygen-free dielectric hillocks in the S/D contact landing area. These hillocks are observed to increase contact resistance of the S/D contact and reduce yield. To mitigate one or more of the issues, the present disclosure provides different isolation features in the trench between newly-cut segments of the gate structure and within the ILD in some embodiments, so as to improve contact resistance in the S/D contact landing area.

Figure 1B:
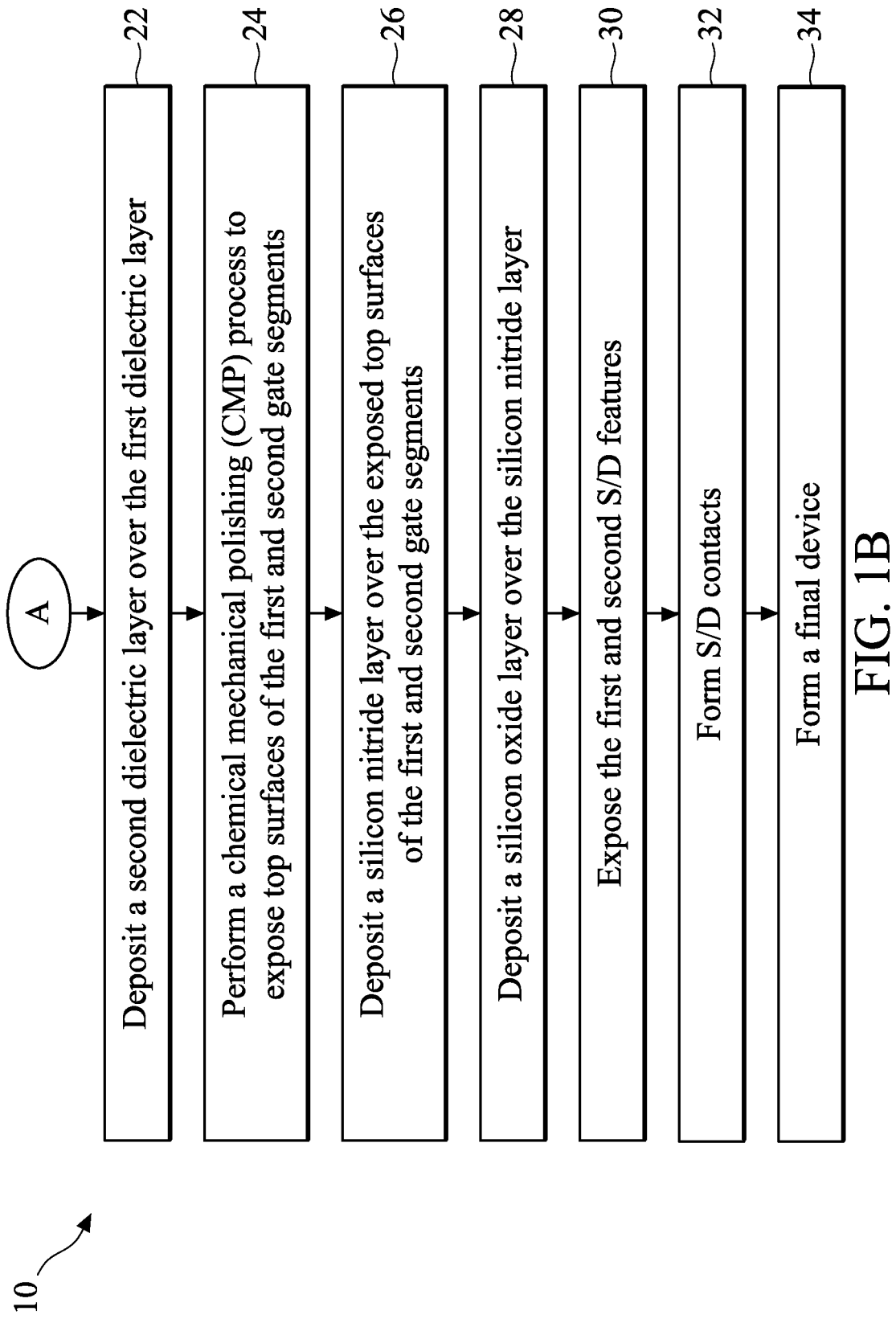

Illustrated in FIGS. 1A and 1B is a method 10 of fabricating a semiconductor device, such as the semiconductor device 100 shown in FIGS. 2-14C, according to embodiments of the present disclosure. The method 10 is merely an example, and is not intended to limit the present disclosure beyond what is explicitly recited in the claims. Additional operation can be provided before, during, and after the method 10, and some operations can be replaced, eliminated, or moved around for additional embodiments of the method. The method 10 is described below in conjunction with FIGS. 2-14C, which are cross-sectional and top views of the semiconductor device 100 in various stages of a manufacturing process.

The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2-14C may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2:
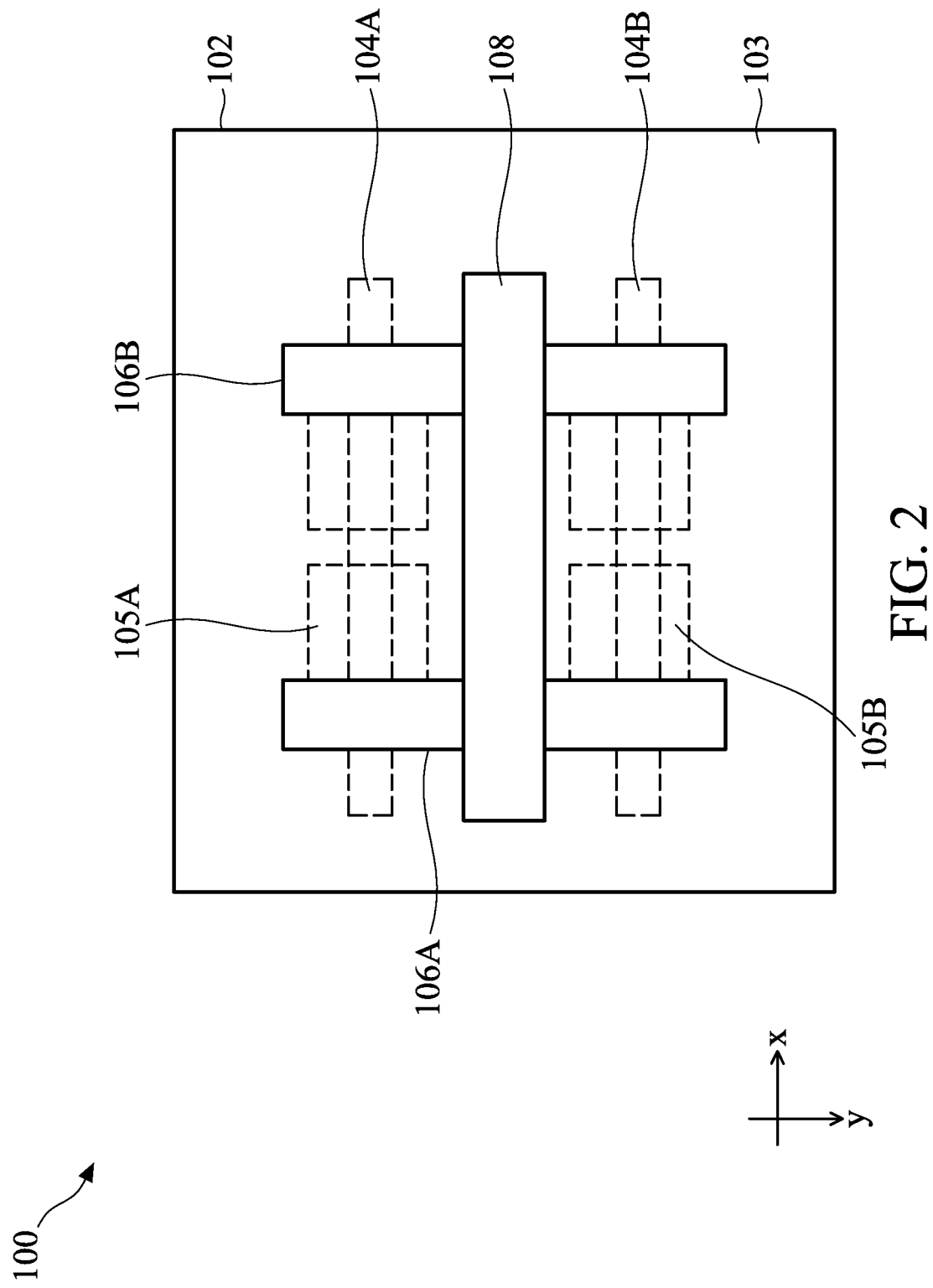
FIG. 2 is a top-view of a semiconductor device and a metal gate cut pattern, in accordance with some embodiments.

Referring to FIG. 1A, at operation 12, the method 10 provides a structure of the semiconductor device 100 as shown in FIG. 2. Referring now to FIG. 2, the structure includes a first fin structure 104A, a second fin structure 104B, a gate stack (or metal gate) 106A, another gate stack (or metal gate) 106B, a first S/D feature 105A over the first fin structure 104A, a second S/D feature 105B over the second fin structure 104B, and an oxygen containing dielectric layer 103 over the first and second S/D features 105A and 105B. The various structures above are disposed over a substrate 102. The gate stacks 106A and 106B extend lengthwise over the first and second fin structures 104A and 104B along a direction "y" generally perpendicular to the lengthwise direction "x" of the first and second fin structure 104A and 104B. The first and second S/D features 105A and 105B are adjacent to the gate stack 106A.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The first and second fin structures 104A and 104B may be patterned by any suitable method. For example, the first and second fin structures 104A and 104B may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the first and second fin structures 104A and 104B. For example, the masking element may be used for etching recesses into the substrate 102, leaving the first and second fin structures 104A and 104B on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the first and second fin structures 104A and 104B may be suitable. Although the first and second fin structures 104A and 104B are illustrated in FIG. 2 as each containing one fin, the first and second fin structures 104A and 104B may include more than one fin. For illustration purposes and not to limit the scope of the present disclosure, each of the first and second fin structures 104A and 104B shown in FIGS. 4A, 4B, 5A, 5B, 6A, 6B, 7A, 7B, 7C, 8A, 8B, 8C, 10A, 10B, 10C, 11A, 11B, 11C, 13A, 13B, 13C, and 14A, 14B, and 14C includes two fins.

The S/D features 105A and 105B may include epitaxial semiconductor materials, for example, for applying proper stress and enhancing performance of the device 100. For example, the S/D features 105A may include epitaxially grown silicon (Si) or silicon carbide (SiC), and the S/D features 105B may include epitaxially grown silicon germanium (SiGe). Further, the S/D features 105A and 105B may be doped with proper dopants suitable for the respective n-type and p-type devices. For example, the S/D features 105A may be doped with an n-type dopant such as phosphorus (P) or arsenic (As), and the S/D features 105B may be doped with a p-type dopant such as boron (B) or indium (In). In one implementation, the S/D feature 105A is formed of epitaxially grown silicon doped with phosphorous and the S/D feature 105B is formed of epitaxially grown silicon germanium doped with boron. In an embodiment, the S/D features 105A and 105B are formed (separately) by etching the first and second fin structures 104A and 104B, epitaxially growing a proper semiconductor material over the first and second fin structures 104A and 104B, and doping (in-situ or ex-situ) appropriate dopants into the epitaxially grown material. In instances where the first and second fin structures 104A and 104B each includes two fins, the S/D features of individual fins may be separated from each other (not shown) or may merge to form a larger S/D features, such as the S/D features 105A and 105B in FIG. 4B. Furthermore, each of the S/D features 105A and 105B may be of a multi-facet shape.

The oxygen containing dielectric layer 103, sometimes referred to as the ILD layer 103, may include, as non-limiting examples of its composition, silicon dioxide, silicon oxynitride, carbon containing dielectrics, TEOS, and combinations of these, and may be low-k, high-k or oxide dielectric, and may be formed of other known materials for ILD layers. It is noted that the oxygen containing dielectric layer 103 is illustrated as a single layer but the device may also include other dielectric materials such as additional spacer elements, etch stop layers, and the like.

Each of the gate stacks 106A and 106B is a multi-layer structure. For example, each of the gate stacks 106A and 106B may include a dielectric interfacial layer, a high-k gate dielectric layer over the dielectric interfacial layer, a work function layer over the gate dielectric layer, and a gate electrode layer over the work function layer. As both the work function layer and the gate electrode layer are conductive, sometimes they can be generally referred to as a conductive layer. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The gate electrode layer may include polysilicon or a metal such as aluminum (Al), tungsten (W), cobalt (Co), copper (Cu), and/or other suitable materials. The work function layer may be p-type (for gate stacks 106B) or n-type (for gate stacks 106A). The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The p-type or n-type work function layer may include a plurality of layers and may be deposited by CVD, PVD, ALD, and/or other suitable process.

Although not shown, sidewalls of the gate stacks 106A and 106B are covered by a gate spacer. The gate spacer may be a single layer or multi-layer structure. In some embodiments, the gate spacer includes a dielectric material, such as silicon oxide ($SiO_2$), silicon nitride (SiN), silicon oxynitride (SiON), other dielectric material, or combination thereof. In an example, the gate spacer is formed by blanket depositing a first layer (e.g., a $SiO_2$ layer having a uniform thickness) as a liner layer over the device 100 having the gate stacks 106A and 106B, and another dielectric layer (e.g., a SiN layer) as a main D-shaped spacer over the first dielectric layer, and then, anisotropically etching to remove portions of the dielectric layers to form the gate spacer. In some embodiments, to prevent degradation of the work function layers and metal layers due to oxidation, the work function layers and metal layers of the gate stacks 106A and 106B are protected by one or more barrier layers such that they are not in direct contact with any oxygen containing materials.

What is also shown in FIG. 2 is a metal gate cut pattern 108 (sometimes can also be referred to as "a cut metal gate pattern" or "a gate cut pattern"). The metal gate cut pattern 108 is generally parallel to the lengthwise direction of the first and second fin structures 104A and 104B. With respect to the gate stacks 106A and 106B, the metal gate cut pattern 108 is generally perpendicular to the lengthwise direction of the first and second gate stacks 106A and 106B.

Figure 3:
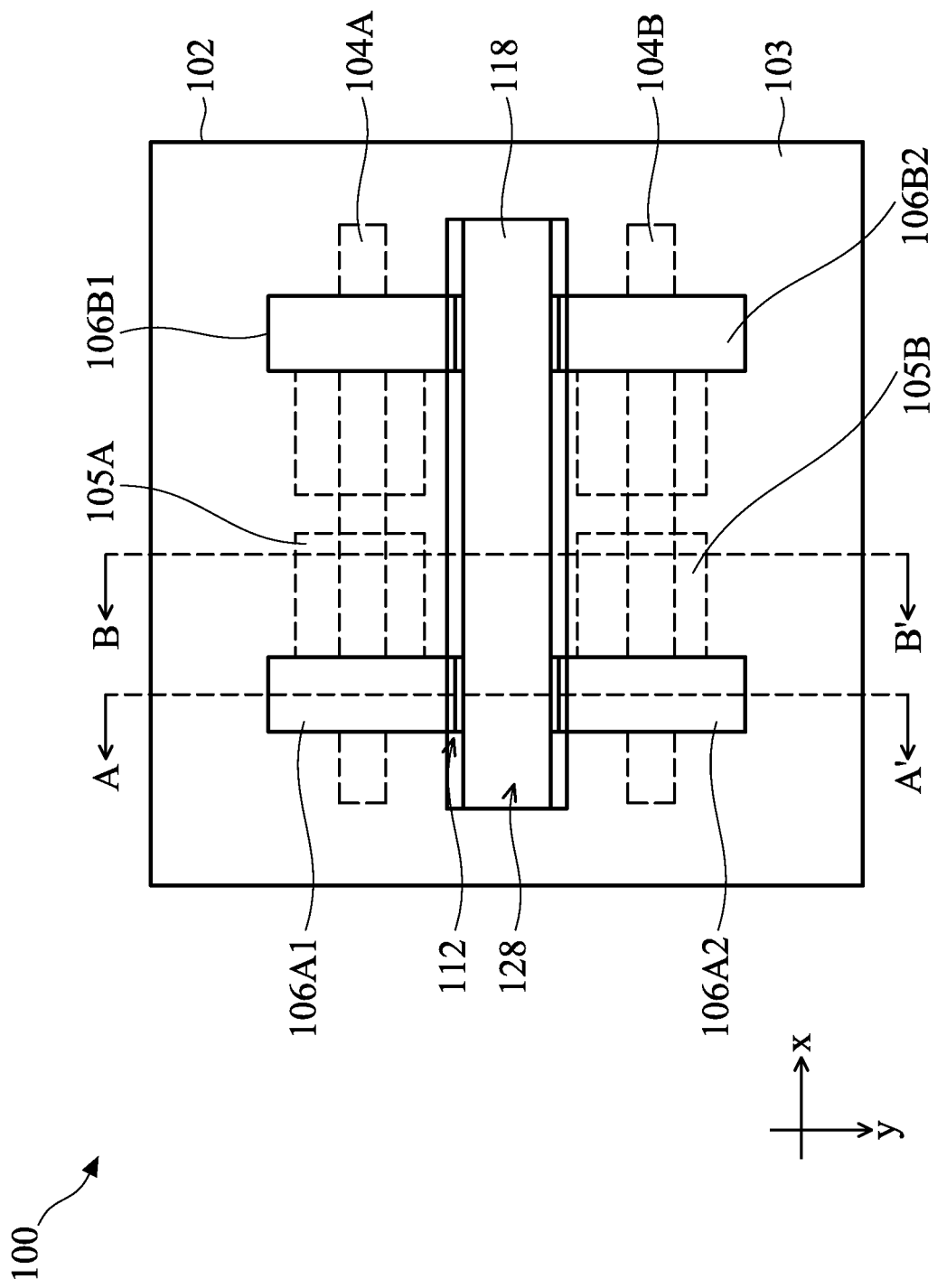
FIG. 3 is a top view of a semiconductor device with metal gate structures, in which a metal gate cut has been performed, in accordance with embodiments of the present disclosure.

Referring now to FIG. 3, at operation 14 (FIG. 1A) of the method 10, a metal gate cut process is performed by etching a trench 118 into the gate stacks 106A, 106B and the oxygen containing dielectric layer 103 (the ILD 103). The trench 118 extends along a direction that is generally perpendicular to the lengthwise direction of the gate stacks 106A and 106B, and separates the gate stack 106A into a gate segment 106A1 and a gate segment 106A2. Similarly, the trench 118 separates the gate stack 106B into a gate segment 106B1 and a gate segment 106B2. The trench 118 also includes a trench bottom 128 as shown in FIG. 3. The trench bottom 128 defines how deep the trench 118 is etched into the gate stacks 106A and 106B.

Figures 4A, 4B:
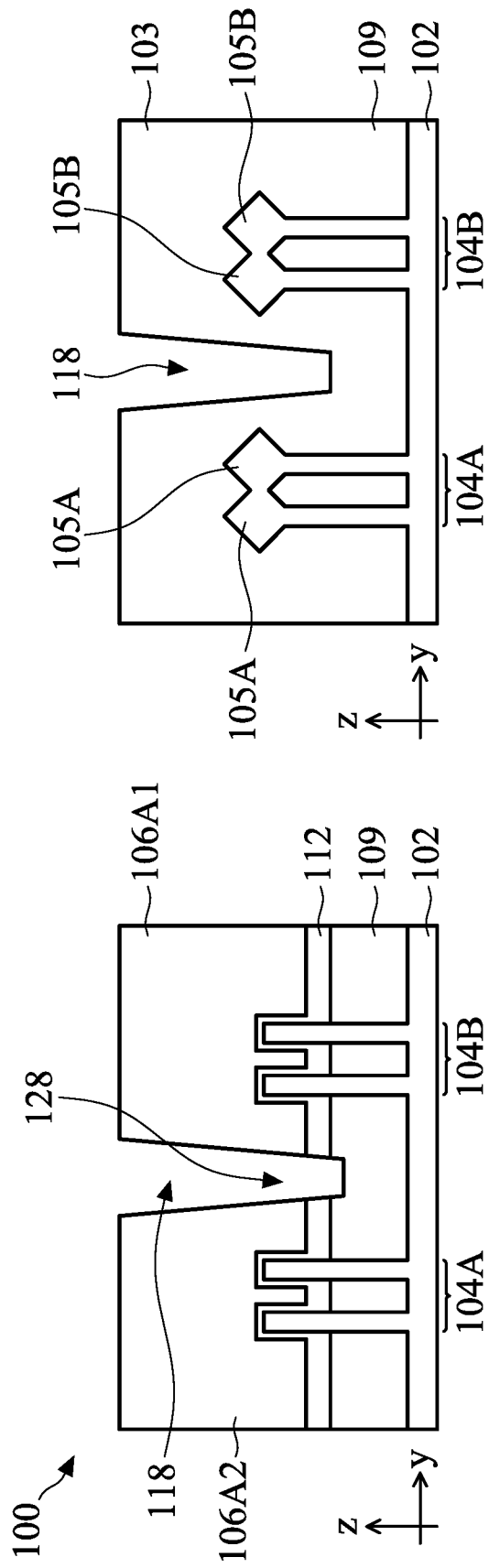

Reference is now made to FIGS. 4A and 4B. FIG. 4A illustrates a cross-sectional view of the gate segments 106A1 and 106A2 along a "y-z" plane substantially parallel to a plane defined by section AA' of FIG. 3. To ensure that the trench 118 completely separates the gate segment 106A1 from the gate segment 106A2, the trench bottom 128 of the trench 118 should be below a bottom surface of the gate segments 106A1 and 106A2, as shown in FIG. 4A. In implementations where the bottom surfaces of the gate segments 106A1 and 106A2 are generally coplanar with the top surface of an isolation region 109, the trench bottom 128 is coplanar or below the top surface of the isolation region 109. In some embodiments, the isolation region 109 is sometimes referred to as a shallow trench isolation (STI) and may include silicon oxide ($SiO_2$), silicon nitride (SiN), silicon oxynitride (SiON), fluoride-doped silicate glass (FSG), a low-k dielectric material, and/or other suitable insulating material. In an embodiment, the isolation region 109 is formed by etching trenches in the substrate 102 (e.g., as part of the process of forming the first and second fin structures 104A and 104B), filling the trenches with an insulating material using chemical vapor deposition (CVD), and performing a chemical mechanical planarization (CMP) process to the substrate 102 and the insulating material. Other types of isolation structure may also be suitable, such as field oxide and LOCal Oxidation of Silicon (LOCOS).

In some embodiments represented by FIG. 4A, the trench 118's top opening is wider than its trench bottom 128 and sidewalls of the trench 118 is tapered. The tapering can be attributed to the etching process or etchant used to perform the metal gate cut. As shown in FIG. 4A, the tapered sidewalls of the trench 118 exposes a sidewall of the gate segment 106A1, and a sidewall of the gate segment 106A2. In particular, the exposed sidewalls of the gate segments 106A1 and 106A2 include a dielectric interfacial layer and a gate dielectric layer near the trench bottom 128. As discussed above with respect to the gate stacks 106A and 106B, the dielectric interfacial layer includes silicon oxide ($SiO_2$) or silicon oxynitride (SiON) and the gate dielectric layer includes high-K metal oxides, such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides. Therefore, as both the dielectric interfacial layer and the gate dielectric layer contain oxygen, they can be referred to jointly as an exposed oxygen-containing portion 112. Compared to the exposed oxygen-containing portion 112, the rest of the exposed sidewalls of the gate segments 106A1 and 106A2 include metals, metal nitrides, metal carbide nitrides, and metal silicide nitrides and are substantially free of oxygen or free of oxygen atoms.

Referring now to FIG. 4B, shown therein is a cross-sectional view of the ILD 103 along the "y-z" plane substantially parallel to a plane defined by section BB' of FIG. 3. In embodiments represented by FIG. 4B, the trench 118 extends between the first S/D feature 105A and the second S/D feature 105B. The first S/D feature 105A is formed over the first fin structure 104A and the second S/D feature 105B is formed over the second fin structure 104B. As described above, both the ILD 103 and STI 109 can be formed of materials that contain oxygen, such as silicon oxide ($SiO_2$), silicon nitride (SiN), silicon oxynitride (SiON).

Figures 5A, 5B:
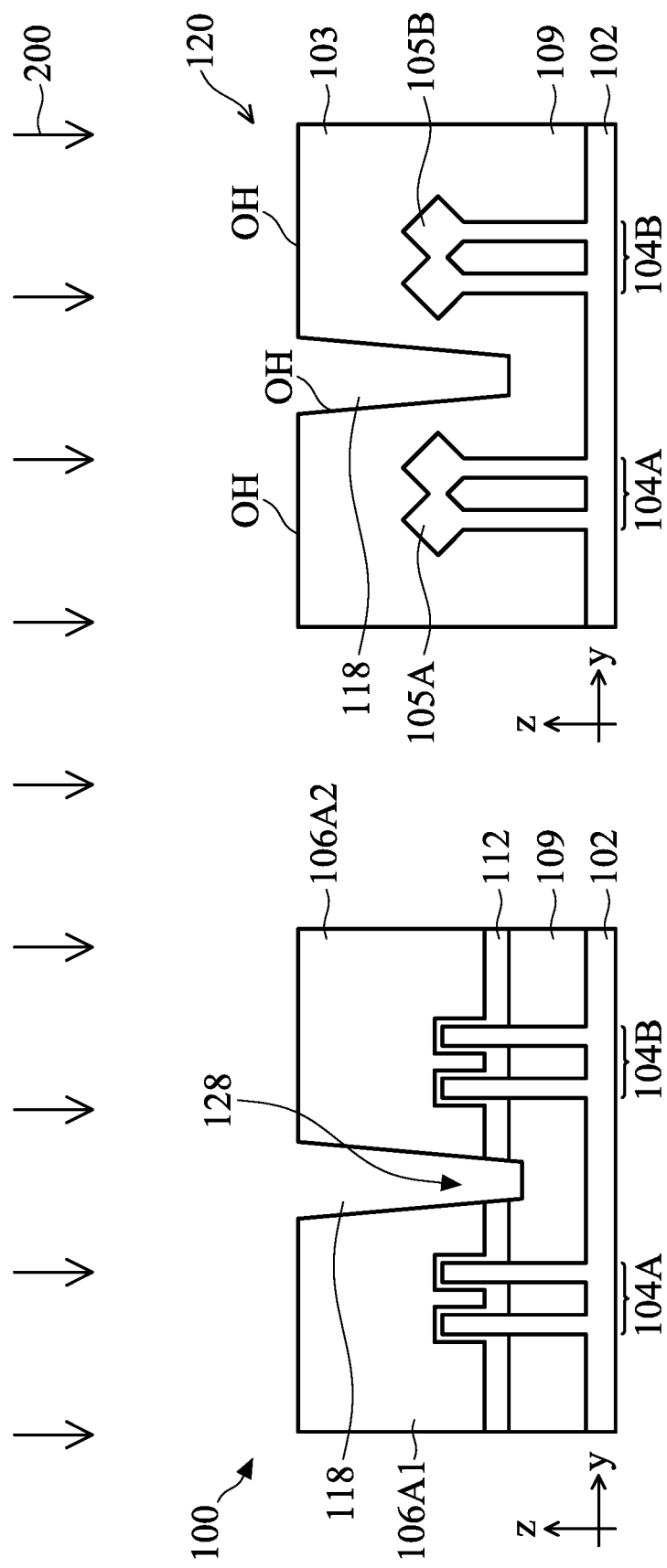

At operation 16 (FIG. 1A) of the method 10, as shown in FIGS. 5A and 5B, a treatment 200 is performed to the structure of the semiconductor device 100 such that uncovered surfaces of the oxygen-containing dielectric layer 103 (the ILD 103) include hydroxyl group (OH). In some embodiments, the treatment 200 includes use of plasma of an inert gas, such as argon (Ar), and a hydrogen-containing gas or reagent, such as hydrogen gas ($H_2$), water vapor and silane. In instances where Ar plasma and hydrogen are used for the operation 16, the treatment 200 can be referred to as a treatment by Ar—$H_2$ plasma. In some other embodiments, the hydrogen-containing gas is allowed to react with surfaces of the oxygen-containing dielectric layer 103 (the ILD 103) without the use of an inert gas plasma. In some implementations, hydroxyl groups also form on the exposed oxygen-containing portion 112 of the gate stacks 106A and 106B during the treatment process 200. With the exception of the exposed oxygen-containing portion 112, the treatment 200 performed at the operation 16 does not form any hydroxyl groups on exposed sidewalls of the gate segments 106A1 and 106A2. In embodiments of the present disclosure, the treatment 200 is selected such that no hydroxyl groups are formed on surfaces of metals, metal nitrides, metal carbide nitrides, and metal silicide nitrides. Because work function layers and gate electrode layers of the gate segments 106A1 and 106A2 include only metals, metal nitrides, metal carbide nitrides, and metal silicide nitrides, during and upon completion of the treatment process, no hydroxyl group is formed on exposed surfaces of the work function layers and gate electrode layers of the gate segments 106A1 and 106A2.

Figures 6A, 6B:
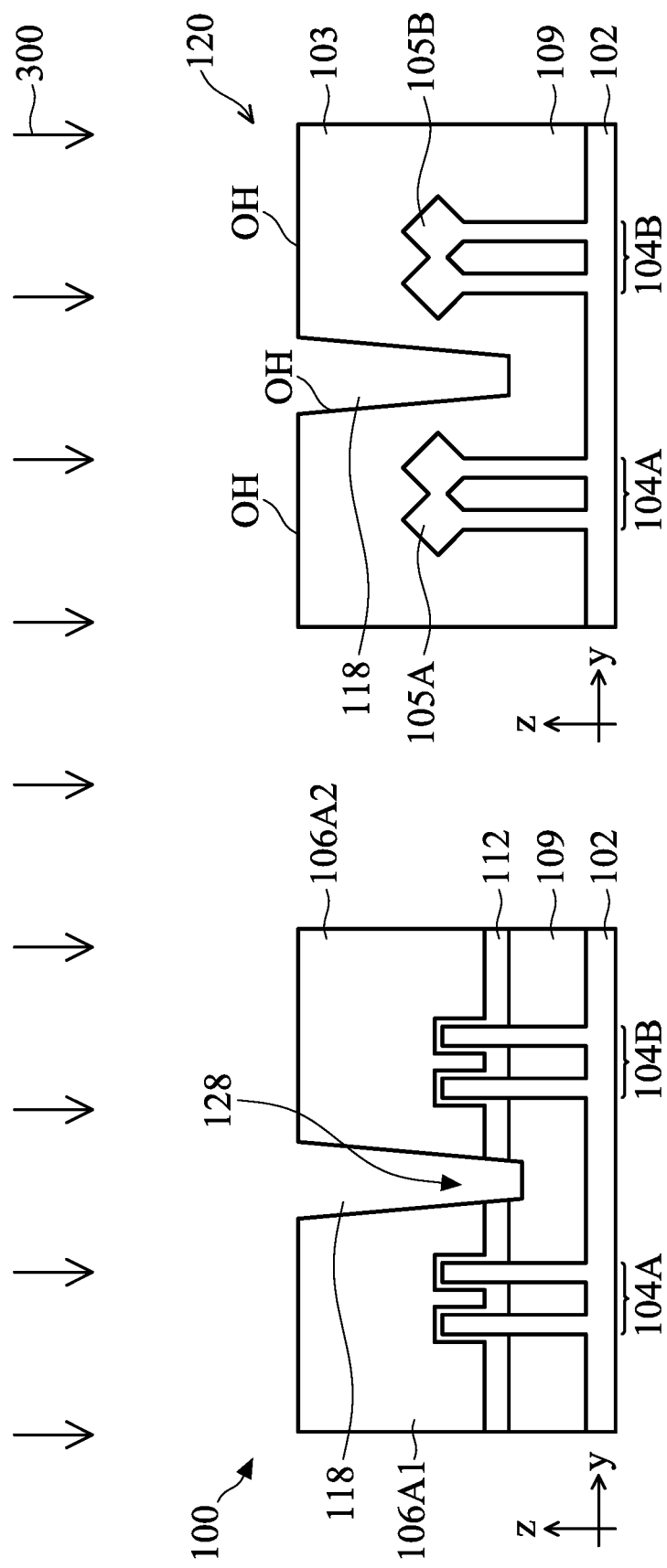

Referring now to FIGS. 6A and 6B, the operation 18 (FIG. 1A) of the method 10 includes soaking the structure of the semiconductor device 100 with an inhibitor 300 bondable to hydroxyl groups. In some embodiments, the inhibitor 300 is mixed with and transported by a carrier gas, such as argon, nitrogen, or other suitable inert gas. In some embodiments, the inhibitor 300 is designed and configured to bond to the hydroxyl groups on exposed surfaces of the oxygen-containing dielectric layer 103 (or the ILD 103) and the exposed oxygen-containing portion 112. In some implementations, the inhibitor 300 is in its gaseous phase under the process conditions of the operation 18 and can include an exemplary general chemical formula of $SiR_3L$, where R denotes an alkyl group and L denotes a detachable group. In some implementations, the pressure of the inhibitor soaking process at the operation 18 falls within a range between 5 torr to 100 torr. Examples of inhibitors 300 with the foregoing general chemical formula include N-Trimethylsilylpyrrole ($C_7H_{13}NSi$), octadecyltrichlorosilane (ODTS, $C_{18}H_{37}Cl_3Si$), or trimethylchlorosilane (TMCS, also known as trimethylsilylchloride, $(CH_3)_3SiCl$). The inhibitor 300 can form a covalent bond or a hydrogen bond with the hydroxyl groups on exposed surface of the ILD 103 or the exposed oxygen-containing portion 112. In instances where a covalent bond is formed, the detachable group will form a compound with the hydroxyl group or the hydrogen atom of the hydroxyl group while the rest of the inhibitor 300 is bonded to the surfaces. For example, in cases where in the inhibitor 300 is trimethylsilylchloride, chloride is the detachable group that can form hydrogen chloride with the hydrogen atom of the hydroxyl group, while the trimethylsilyl group is bonded to the exposed surfaces of the ILD 103 and the exposed oxygen-containing portion 112. The inhibitors 300 can occupy reaction sites, such as dangling bonds or hydroxyl functional groups, on surfaces they are bonded to and sterically hinder precursors of oxygen-free dielectric materials (such as silicon nitride and silicon carbide nitride) from bonding to the same surfaces. Because inhibitors 300 are only bonded to surfaces with hydroxyl bonds and surfaces of work function layers and gate electrode layers are free of hydroxyl bonds, no inhibitors 300 are bonded to exposed surfaces of the work function layers and gate electrode layers to hinder deposition of oxygen-free dielectric materials, such as silicon nitride and silicon carbide nitride. In some embodiments, the inhibitor soaking process at the operation 18 can last for 10 to 40 minutes. In some implementations, the inhibitor soaking process at the operation 18 is performed at a temperature between 350° C. and 550° C.

Referring now to FIGS. 7A, 7B, and 7C, at the operation 20, an oxygen-atom free dielectric material is deposited over the semiconductor device 100 to form the first dielectric layer 116. Reference is now made to FIG. 7A. Except for the exposed oxygen-containing portion 112, the top surfaces and sidewalls of the gate segments 106A1 and 106A2 comprise of oxygen-free surfaces made of metals, metal nitrides, metal carbide nitrides, and metal silicide nitrides. As no hydroxyl groups can be created on these oxygen-free surfaces by the treatment at the operation 18, inhibitors 300 do not bond to these surfaces. That is, at the operation 20, the oxygen-free dielectric materials can be deposited on the top surfaces and sidewalls of the gate segments 106A1 and 106A2, with the exception of the exposed oxygen-containing portion 112. This is so because, at the operation 118, inhibitors 300 are allowed to bond to the exposed sidewalls of the exposed oxygen-containing portion 112 in the trench 118 and the inhibitors 300 sterically hinder deposition of oxygen-free dielectric materials thereon. Deposition of the oxygen-free dielectric materials results in the first dielectric layer 116 on top surfaces of the gate segments 106A1 and 106A2 and on sidewalls of the gate segments 106A1 and 106A2 exposed in the trench 118. In some embodiments, the oxygen-free dielectric material is silicon nitride. Because the trench 118 can be as narrow as tens of nanometers, a deposition method with better trench-filling ability is used. In some instances, the oxygen-free dielectric material is deposited using atomic layer deposition (ALD) or plasma-enhanced atomic layer deposition (PE-ALD). In some embodiments represented by FIG. 7A, the trench 118 is only partially filled by the oxygen-free dielectric material, leaving behind a narrower trench feature within the trench 118. As also shown in FIG. 7A, because inhibitors 300 are bonded to the exposed oxygen-containing portion 112 and form a steric hindrance layer 121 over the exposed oxygen-containing portion 112, the oxygen-free dielectric material cannot be deposited on the exposed oxygen-containing portion 112. The exposed oxygen-containing portion 112 is therefore not in direct contact with the oxygen-free dielectric materials. In some other embodiments represented by FIG. 7B, the trench 118 is completely filled by the oxygen-free dielectric material. Similar to the embodiments represented by FIG. 7A, the steric hindrance layer 121 prevents the oxygen-free dielectric material from being deposited on the exposed oxygen-containing portion 112. Even if the trench 118 filled with the oxygen-free dielectric material, the structure of the oxygen-free material near the exposed oxygen-containing portion can include imperfections such as voids and lattice defects due to the presence of the steric hindrance layer 121. Therefore, in FIG. 7B, the first dielectric layer 116 is shown as being not in direct contact with the exposed oxygen-containing portion 112.

FIG. 7C illustrates a cross-sectional view of a portion of the ILD 103 between the S/D features 105A and 105B along a "y-z" plane substantially parallel to a plane defined by section BB' of FIG. 3. Unlike the gate segments 106A1 and 106A2, the exposed surfaces of the ILD 103 are bonded to inhibitors 300 at the operation 18 and the oxygen-free dielectric material, such as silicon nitride and silicon carbide nitride, is prevented from being deposited thereon. Therefore, as shown in FIG. 7C, the trench 118 within the ILD 103 remains unfilled and the top surface of the ILD 103 is also not covered by the oxygen-free dielectric material. As shown in FIG. 7C, the trench 118 includes a bottom trench width W1, a trench height H1, and a trench opening width W2. In some embodiments, the bottom trench width W1 and the trench opening width W2 can be substantially the same and the aspect ratio of the trench 118 may range from 3 to 10, such as from 4 to 8, or from 5 to 7. In those embodiments, the trench height H1 is between 90 nm and 140 nm and the bottom trench width W1 and the trench opening width W2 both range between 5 nm and 30 nm. In some other embodiments, the trench opening width W2 is larger than the bottom trench width W1. In those embodiments, the sidewalls of the trench 118 are tapered. In some instances, the sidewalls of the trench 118 are tapered at a tapering angle ranging from 1° (degree) to 10° (degree). In those embodiments, the bottom trench width W1 is between 5 nm and 15 nm, the trench height H1 is between 90 nm and 140 nm, and the trench opening width W2 is between 20 nm and 30 nm.

Referring now to FIGS. 8A, 8B, and 8C, at the operation 22 (FIG. 1B) of the method 10, an oxygen-containing dielectric material, such as silicon oxide, is deposited over the semiconductor device 100 to form a second dielectric layer 113. In some embodiments, because the trench 118, with or without a first dielectric layer 116, can be as narrow as tens of nanometers, a deposition method with better trench-filling ability is used to deposit the second dielectric layer 113. In some instances, the oxygen-containing dielectric material is deposited using ALD or PE-ALD. As compared to CVD, which is a relatively fast, continuous process with presence of all reactant gases, ALD and PE-ALD are relatively slow process with deposition cycles with separate reactant gas delivery. As a result, as compared to a material layer formed using CVD, a material layer formed using ALD has better thickness control, greater conformity to the topography of the underlying surfaces, less discontinuity caused by nucleation, and lower stress level. Taking silicon oxide (SiO$_2$) as an example, as compared to silicon oxide layer formed using CVD, silicon oxide layer formed using ALD has better thickness control, greater conformity to the topography of the underlying surfaces, less discontinuity caused by nucleation, and lower stress level. As a result of the use of ALD or PE-ALD process, the second dielectric layer 113 is different from the isolation region 109 in terms of conformity, continuity and stress level. In embodiments where the trench 118 between the gate segments 106A1 and 106A2 is partially filled by the oxygen-free dielectric material (the first dielectric layer 116), as represented by FIG. 8A, the oxygen-containing material fills in the residual space of the trench 118 between the gate segments 106A1 and 106A2 and also covers the top surfaces of the gate segments 106A1 and 106A2. In other embodiments where the trench 118 between the gate segments 106A1 and 106A2 is completely filled by the oxygen-free dielectric material (the first dielectric layer 116), as represented by FIG. 8B, the oxygen-containing material covers the top surfaces of the gate segments 106A1 and 106A2. As shown in FIG. 8C, at the operation 22, the trench 118 between the first and second S/D features 105A and 105B within the ILD 103 is filled with the oxygen-containing material and the top surface of the ILD 103 is covered by the oxygen-containing material. During the operation 22, sometimes the oxygen-containing dielectric material can block the top opening of the trench 118 before the trench 118 is completely filled with the oxygen-containing material. Therefore, in some embodiments, there can be a sheet-like void in the trench 118 between the first and second S/D features 105A and 105B. Along the viewing direction of the cross-sectional view of FIG. 8C, the sheet-like void has an appearance of a slit. In embodiments shown in FIG. 8A, at operation 22, the steric hindrance layer 121 formed of the inhibitors 300 is converted to the oxygen-containing material, such as silicon oxide, and becomes part of the second dielectric layer 113. In embodiments shown in FIG. 8B, at operation 22, the steric hindrance layer 121 formed of the inhibitors 300 is also converted to the oxygen-containing material, such as silicon oxide.

Referring now to FIGS. 9A, 9B, and 9C, at operation 24 (FIG. 1B), a CMP process is performed to planarize the top surface of the semiconductor device 100 and expose the top surfaces of the gate segments 106A1 and 106A2. In some embodiments represented by FIG. 9A, the trench 118 is filled with both the first dielectric layer 116 and the second dielectric layer 113, with the first dielectric layer 116 covering the sidewalls of the gate segments 106A1 and 106A2. Because the first dielectric layer 116 is formed of an oxygen-free dielectric material, the sidewalls of the gate segments 106A1 and 106A2 are not in direct contact with the oxygen-containing dielectric material that forms the second dielectric layer 113. In some other embodiments represented by FIG. 9B, the first dielectric layer 116 completely fills the trench 118 between the gate segments 106A1 and 106A2. As shown in FIG. 9C, the CMP process performed at the operation 24 leaves the trench 118 between the first and second S/D features 105A and 105B filled with the second dielectric layer 113. As discussed above with respect to FIG. 8C, sometimes the trench 118 between the first and second S/D features 105A and 105 is not completely filled by the oxygen-containing material. It can also include a sheet-like void, shown as a slit in FIG. 9C.

In some embodiments represented by FIG. 9A, gate stacks 106A and 106B include a thickness H2, which includes a total thickness H3 for the dielectric interfacial layers and gate dielectric layers. In some implementations, the ratio of the thickness H3 over the thickness H2 is between 5 and 20, such as between 7 and 14. In some instances, the thickness H2 falls within a range between 70 nm and 100 nm. In some implementations, the thickness H3 falls within a range between 5 nm and 10 nm.

Reference is now made to FIGS. 10A, 10B, and 10C. At operation 26 (FIG. 1B), a silicon nitride layer 126 is deposited over the semiconductor device 100 after its top surfaces are planarized at the operation 24, including over the top surfaces of the gate segments 106A1 and 106A2. Because the silicon nitride layer 126 is to be deposited on a planarized surface, it can be deposited using methods with or without trench filling capabilities. In some embodiments, the silicon nitride layer 126 can be deposited by CVD or plasma-enhanced CVD (PECVD).

As shown in FIGS. 11A, 11B, and 11C, at operation 28 (FIG. 1B), a silicon oxide layer 123 is deposited over the silicon nitride layer 126 on the semiconductor device 100. Because the silicon oxide layer 123 is to be deposited on a substantially planarized surface, it can be deposited using methods with or without trench filling capabilities. In some embodiments, the silicon oxide layer 123 can be deposited by CVD or PECVD.

In embodiments of the present disclosure, with respect to the trench 118, the gate segments 106A1 and 106A1 are separated by an isolation feature different from another isolation feature present within the ILD 103. As shown in FIGS. 11A and 11B, the gate segments 106A1 and 106A2 are separated by a first isolation feature 400. The first isolation feature 400 may comprise the second dielectric layer 113 sandwiched between two first dielectric layer 116, as illustrated in FIG. 11A, or the first dielectric layer 116 alone, as illustrated in FIG. 11B. In either case, the work function layers and gate electrode layers in the gate segments 106A1 and 106A2 are not in contact with the oxygen-containing dielectric material that forms the second dielectric layer. In some implementations, the second dielectric layer 113 is in contact with the inhibitors 300 bonded on the exposed oxygen-containing portion 112. In some other implementations, the inhibitor 300 bonded on the exposed oxygen-containing portion 112 is oxidized and converted to silicon oxide. In embodiments represented by FIG. 11B, while the oxygen-free dielectric material is not in direct contact with exposed oxygen-containing portion 112, the first dielectric layer 11 includes a tip 122 that extends between the exposed oxygen-containing portions 112 of the gate segments 106A1 and 106A2. The tip 122 is separated from the exposed oxygen-containing portion 112 by a layer formed of the inhibitors 300 bonded thereon or a silicon oxide layer converted from the inhibitors 300 during the formation of the second dielectric layer 113. In contrast, as shown in FIG. 11C, the trench 118 between the first and second S/D features 105A and 105B is filled with a second isolation feature 500. In some embodiments, the second isolation feature 500 includes inhibitors 300 bonded on the sidewalls of the ILD 103 and the oxygen-containing material that forms the second dielectric layer 113. In some implementations, the inhibitors 300 bonded on the sidewalls of the ILD 103 may be converted to silicon oxide during the formation of the second dielectric layer 113. Compared to the first isolation feature 400, the second isolation feature 500 is free of the oxygen-free dielectric material, such as silicon nitride or silicon carbide nitride.

Figure 12A:
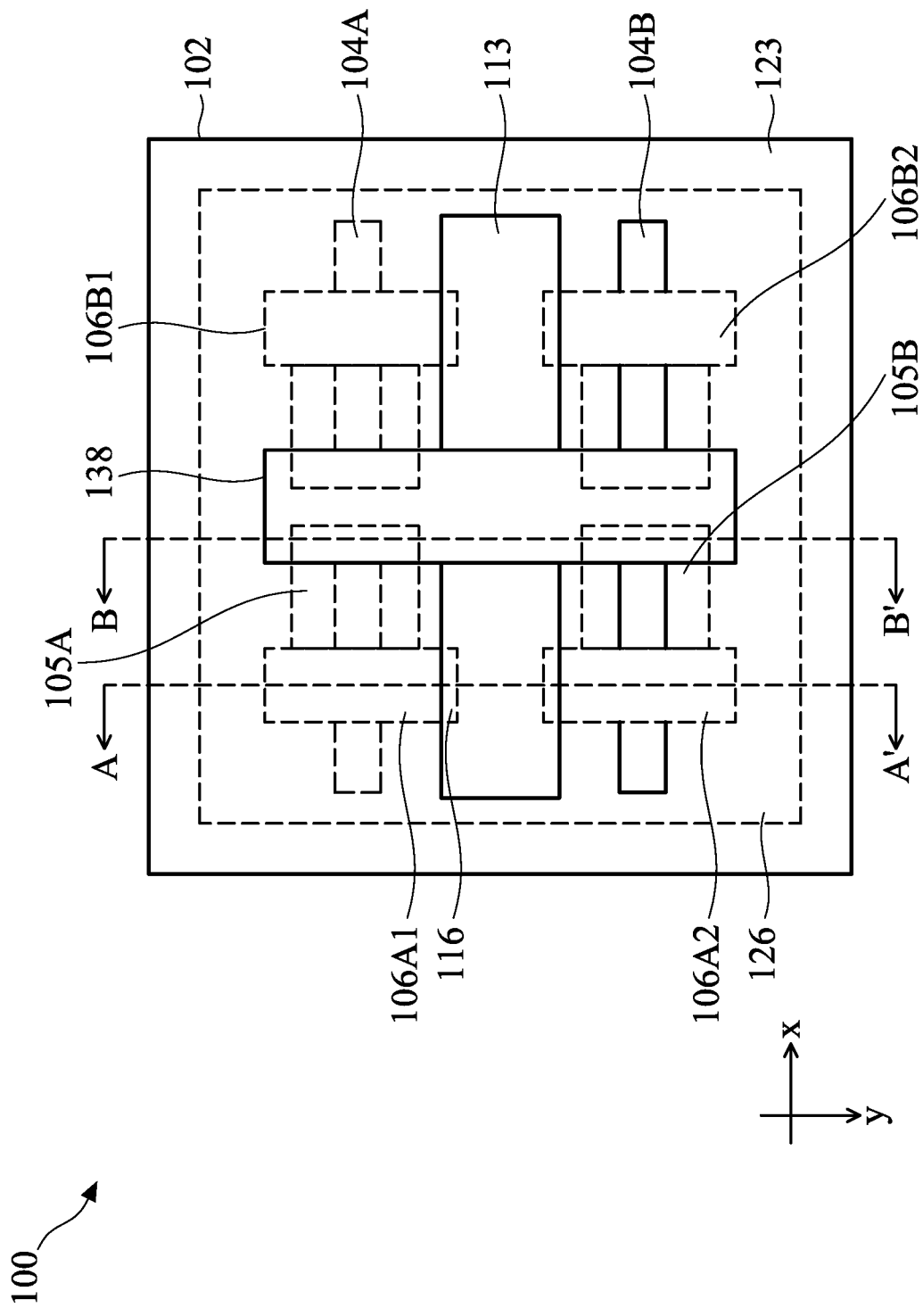
FIG. 12A is a top view of a semiconductor device with metal gate segments separated by a first isolation feature and covered by dielectric layers, in accordance with another embodiment of the present disclosure.
Figure 12B:
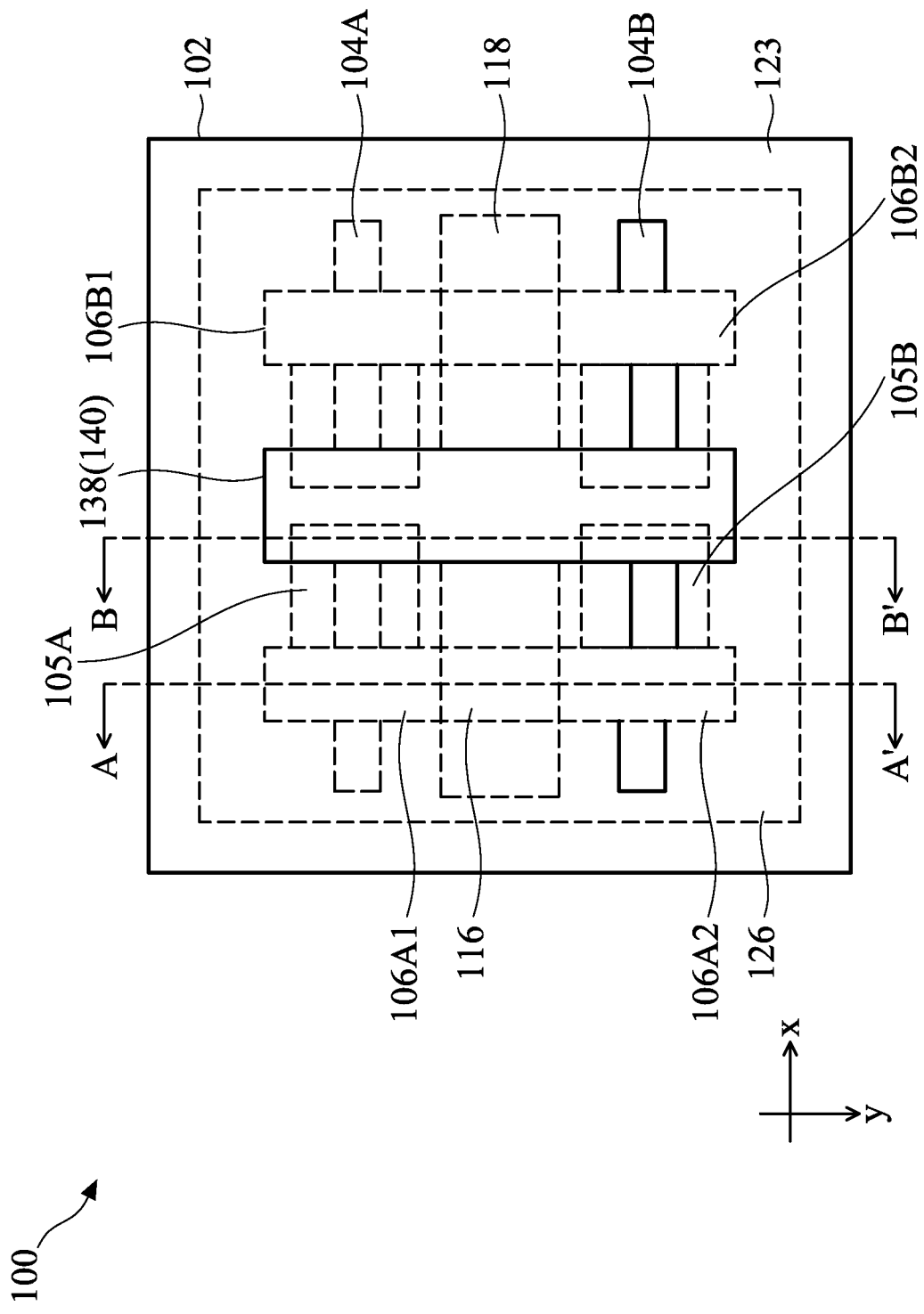
FIG. 12B is a top view of a semiconductor device with metal gate segments separated by a first isolation feature and covered by dielectric layers, in accordance with an embodiment of the present disclosure.

At operation 30 (FIG. 1B) of the method 10, the first and second S/D features 105A and 105B are exposed. As shown in FIGS. 12A and 12B, an S/D contact pattern 138 can be used for the operation 30. Along a direction generally perpendicular to the substrate 102, the S/D contact pattern 138 is over the first and second S/D features 105A and 105B and the trench 118 therebetween. In some embodiments, the area outside of the S/D contact pattern is masked, and an etching process is performed to remove the silicon oxide layer 123, the second dielectric layer 113 and the ILD 103 under the S/D contact pattern. Referring now to FIG. 13C, a contact trench 140 can be formed at the operation 30. In some embodiments, at least a part of the S/D feature 105A and a part of the S/D feature 105B are exposed in the contact trench 140. As shown in FIGS. 13A and 13B, because the area outside the S/D contact pattern is masked during the formation of the contact trench 140, the silicon oxide layer 123 over the gate segments 106A1 and 106A2 is not etched during the operation 30. If the trench 118 between the S/D features 105A and 105B is not covered by the inhibitor 300 at the operation 18 (FIG. 1A), the first dielectric layer 116 would be formed therein. In instances where the first dielectric layer 116 is formed of silicon nitride, the first dielectric layer 116 would experience a slower etching as compared to the second dielectric layer 113 and the ILD 103. In that case, the contact trench 140 would not include a recess between the first and second S/D features 105A and 105B, but would include a hillock extending above the first and second S/D features 105A and 105B. The hillock can increase the contact resistance between a contact feature to be formed in the contact trench 140 and the first and second S/D features 105A and 105B.

In some embodiments represented by FIG. 13C, the contact trench 140 can include a wider upper portion and a narrower lower portion. In some implementations, the upper portion and the lower portion can have sidewalls that are substantially vertical to the substrate 102. In those implementations, the upper portion includes a width W3 and the lower portion includes a width W4. In some embodiments, the width W3 ranges from 80 nm to 120 nm. In some embodiments, the width W4 ranges from 20 nm to 30 nm. In some instances, W3 is about 2 to 6 times of W4, such as 3 to 5 times of W4. In some instances, W4 is about 1.2 to 6 times of W1, such as 2 to 5 times of the bottom trench width W1. In some other implementations, the upper and lower portions can each have tapered sidewalls such that the upper and lower portions have wider top opening and narrower bottoms. In some other implementations, the upper and lower portions have narrower top openings and wider bottoms. In some embodiments represented by FIG. 13C, the upper portion of the contact trench 140 includes a shoulder 144 and the lower portion of the contact trench 140 includes a shoulder 145. In some implementations, the shoulders 144 and 145 are rounded as shown in FIG. 13C. In some other implementations, the shoulders 144 and 145 can include a 90-degree angle or an angle larger than 90 degrees.

In addition, as shown in FIG. 13C, the contact trench 140 may expose some surfaces of the S/D features 105A and 105B and extend between the S/D features 105A and 105B in some implementations. In some embodiments, the formation of the contact trench 140 does not remove a bottom portion of the second dielectric layer 113 (hereinafter referred to as the bottom portion 143). The bottom portion 143 is thus positioned between the S/D features 105A and 105B and right below a bottom 142 of the lower portion of the contact trench 140. Like the second dielectric layer 113, the bottom portion 143 is formed of oxygen-containing dielectric materials, such as silicon oxide deposited using ALD or PE-ALD processes. In some embodiments, the bottom 142 of the contact trench has a width between 5 and 15 nm, which can be substantially identical to the bottom trench width W1.

In the embodiments represented by FIG. 13C, the wider upper portion of the contact trench 140 includes a depth H4, the lower portion of the contact trench 140 includes a depth H5, and the bottom portion 143 includes a depth H6. In some implementations, the depth H4 ranges between 60 and 90 nm, the depth H5 ranges between 20 and 40 nm, and the depth H6 ranges between 5 and nm. In some instances, the depth H4 is about 2 to 3 times of the depth H5 and the depth H4 is about 3-10 times of the depth H6.

Referring to FIG. 14C, at operation 32 (FIG. 1B) of the method 10, an S/D contact 150 is formed within the contact trench 140 by depositing a metal in the contact trench 140. As shown in FIG. 14C, the S/D contacts 150 fill the contact trench 140 and cover the top and side surfaces of the first and second S/D features 105A and 105B. That is, the S/D contact 150 is not only formed over top surfaces 155A and 155B of the first and second S/D features 105A and 105B, it also extends between the first and second S/D features 105A and 105B. In some embodiments, the S/D contacts 150 may comprise tungsten (W), cobalt (Co), copper (Cu), other elemental metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In some embodiments, to reduce contact resistance, a silicide layer can be formed over the first and second S/D features 105A and 105B before the S/D contact 150 is deposited in the contact trench 140. To form a silicide layer, a metal layer is deposited over the first and second S/D features 105A and 105B, then an annealing process is performed to cause reaction between the metal layer and the underlying semiconductor material to form metal silicide, and excess unreacted metal is removed. In various embodiments, the metal layer may include titanium (Ti), nickel (Ni), cobalt (Co), tantalum (Ta), erbium (Er), yttrium (Y), ytterbium (Yb), platinum (Pt), or combinations thereof.

At operation 34 (FIG. 1B) of the method 10, the semiconductor device 100 may continue to undergo further processing to form various features and regions known in the art. For example, subsequent processing may form various contacts/vias/lines and multilayers interconnect features (e.g., metal layers and interlayer dielectrics) on the substrate 102, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Semiconductor devices and methods of fabricating semiconductor devices are provided. In one embodiment, the present disclosure provides a semiconductor device that includes a first fin structure and a second fin structure each extending from a substrate; a first gate segment over the first fin structure and a second gate segment over the second fin structure, the first and second gate segments aligned along a lengthwise direction; a first isolation feature disposed in a trench extending along a direction generally parallel to the first and second fin structures from a top view, wherein the first isolation feature separates the first and second gate segments; a first source/drain (S/D) feature over the first fin structure and adjacent to the first gate segment; a second S/D feature over the second fin structure and adjacent to the second gate segment; and a second isolation feature also disposed in the trench. The first and second S/D features are separated by the second isolation feature, and a composition of the second isolation feature is different from a composition of the first isolation feature.

In some embodiments, each of the first fin structure and the second fin structure comprises at least one fin. In some embodiments, the second isolation feature is free of silicon nitride. In some implementations, the second isolation feature is formed using atomic layer deposition (ALD) and the second isolation feature is surrounded by a third isolation feature formed using chemical vapor deposition (CVD). In some embodiments, the first isolation feature includes silicon oxide over silicon nitride. In some instances, the first isolation feature includes silicon nitride. In some embodiments, the first and second gate segments each includes a dielectric layer and a conductive layer, the dielectric layer is not in contact with silicon nitride of the first isolation feature, and the conductive layer is in contact with silicon nitride of the first isolation feature.

In another embodiment, a method of fabricating a semiconductor device is provided. The method includes providing a structure, the structure including a substrate; a first fin structure and a second fin structure each extending from the substrate; a first gate segment over the first fin structure and a second gate segment over the second fin structure, the first and second gate segments extending along a first direction; a first source/drain (S/D) feature over the first fin structure and adjacent to the first gate segment; a second S/D feature over the second fin structure and adjacent to the second gate segment; an oxygen-containing dielectric layer over the first and second S/D features; and a trench extending along a second direction between the first and second gate segments and within the oxygen-containing dielectric layer, the trench separating the first and second gate segments, the second direction being generally perpendicular to the first direction, wherein the trench exposes a sidewall of the first gate segment, a sidewall of the second gate segment, and sidewalls of the oxygen-containing dielectric layer. The method further includes treating the exposed sidewall of the first gate segment, the exposed sidewall of the second gate segment, and the exposed sidewalls of the oxygen-containing dielectric layer with Ar plasma and a hydrogen-containing reagent, resulting in hydroxyl groups on treated sidewalls of the oxygen-containing dielectric layer; soaking the treated sidewall of the first gate segment, the treated sidewall of the second gate segment, and the treated sidewalls of the oxygen-containing dielectric layer with an inhibitor bondable to hydroxyl groups, resulting in the inhibitor bonded to the sidewalls of the oxygen-containing dielectric layer; and depositing a first dielectric layer over the trench, wherein the first dielectric layer is formed on surfaces free of the inhibitor.

In some embodiments, the first dielectric layer includes silicon nitride and the depositing of the first dielectric layer includes atomic layer deposition (ALD). In some implementations, the method further includes depositing a second dielectric layer over the first dielectric layer. In some embodiments, the second dielectric layer includes silicon oxide. In some embodiments, the method further includes, after the depositing of the second dielectric layer, performing a chemical mechanical polishing (CMP) process to expose top surfaces of the first and second gate segments. In some implementations, the method further includes comprising depositing a silicon nitride layer over the exposed top surfaces of the first and second gate segments. In some embodiments, the inhibitor includes a general formula of SiR3L, wherein R denotes an alkyl group and L denote a detachable group. In some instances, the inhibitor comprises N-Trimethylsilylpyrrole, octadecyltrichlorosilane, or trimethylchlorosilane. In some embodiments, the soaking with the inhibitor lasts for about 10 to 40 minutes. In some implementations, the soaking with the inhibitor is performed at a temperature between about 350° C. and 550° C.

In yet another embodiment, the present disclosure provides a method of fabricating a semiconductor device. The method includes providing a structure, the structure comprising a substrate; a first fin structure and a second fin structure each extending from the substrate; a first gate segment over the first fin structure and a second gate segment over the second fin structure, the first and second gate segments aligned along a lengthwise direction and separated by a trench extending along a direction parallel to the first and second fin structures; a first source/drain (S/D) feature over the first fin structure and adjacent to the first gate segment; a second S/D feature over the second fin structure and adjacent to the second gate segment; and an oxygen-containing dielectric layer over the first and second S/D features, wherein the trench is also positioned within the oxygen-containing dielectric layer and between the first and second S/D features. The method further includes performing a treatment process to the structure such that exposed surfaces of the oxygen-containing dielectric layer comprise hydroxyl groups; soaking the structure with an inhibitor bondable to hydroxyl groups; and depositing a silicon nitride layer over the structure, wherein the silicon nitride layer is formed on surfaces that are free of the inhibitor. In some embodiments, the performing of the treatment process to the structure comprises directing Ar—H2 plasma at the structure. In some embodiments, the inhibitor includes a general formula of SiR3L, wherein R denotes an alkyl group and L denote a detachable group. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A field effect transistor (FET) structure, comprising:
a substrate;
a first FET on the substrate, the first FET including a first semiconductor structure and a first gate structure disposed over the first semiconductor structure, the first gate structure comprising a first gate dielectric layer and a first gate electrode layer;
a second FET on the substrate, the second FET including a second semiconductor structure and a second gate structure disposed over the second semiconductor structure, the second gate structure comprising a second gate dielectric layer and a second gate electrode layer; and
a gate cut feature extending continuously between and in physical contact with an end of the first gate structure and an end of the second gate structure,
wherein the gate cut feature comprises:
a semiconductor nitride layer contacting the end of the first gate electrode layer and the end of the second gate electrode layer, and
a semiconductor oxide layer spaced apart from the end of the first gate electrode layer and the end of the second gate electrode layer by the semiconductor nitride layer, the semiconductor oxide layer being in direct contact with end sidewalls of the first gate dielectric layer and the second gate dielectric layer,
wherein top surfaces of the gate cut feature, the first gate structure and the second gate structure are coplanar.

2. The FET structure of claim 1, further comprising:
a shallow trench isolation feature disposed between the first semiconductor structure and the second semiconductor structure,
wherein a bottom surface of the gate cut feature is disposed over a top surface of the shallow trench isolation feature.

3. The FET structure of claim 2, wherein the semiconductor nitride layer is spaced apart from the shallow trench isolation feature by the semiconductor oxide layer.

4. The FET structure of claim 1, wherein the gate cut feature comprises a top width and bottom width smaller than the top width.

5. The FET structure of claim 4,
wherein the top width is between about 20 nm and about 30 nm,
wherein the bottom width is between about 5 nm and about 15 nm.

6. The FET structure of claim 4, wherein the gate cut feature comprises a height between about 90 nm and about 140 nm.

7. The FET structure of claim 1,
wherein the semiconductor nitride layer comprises silicon nitride,
wherein the semiconductor oxide layer comprises silicon oxide.

8. The FET structure of claim 1,
wherein the first semiconductor structure comprises a first fin element,
wherein the second semiconductor structure comprises a second fin element.

9. A field effect transistor (FET) structure, comprising:
a first FET comprising:
    a first gate structure comprising a first gate dielectric layer and a first gate electrode layer, and
    a first source/drain feature;
a second FET comprising:
    a second gate structure comprising a second gate dielectric layer and a second gate electrode layer, and
    a second source/drain feature;
a gate cut feature disposed between the first gate structure and the second gate structure to electrically isolate an end of the first gate electrode layer and an end of the second gate electrode layer;
a source/drain contact disposed over and electrically coupled to the first source/drain feature and the second source/drain feature; and
a silicon nitride layer disposed directly on top surfaces of the first gate electrode layer, the second gate electrode layer, and the gate cut feature,
wherein the gate cut feature comprises a semiconductor nitride layer contacting the end of the first gate electrode layer and the end of the second gate electrode layer and a semiconductor oxide layer spaced apart from the end of the first gate electrode layer and the end of the second gate electrode layer by the semiconductor nitride layer,
wherein a portion of the source/drain contact extends between the first source/drain feature and the second source/drain feature,
wherein the top surfaces of the first gate electrode layer, the second gate electrode layer, and the gate cut feature are coplanar,
wherein the first gate electrode layer and the second gate electrode layer comprise metals, metal nitrides, metal carbide nitrides, or metal silicide nitrides,
wherein the semiconductor oxide layer being in direct contact with the first gate dielectric layer and the second gate dielectric layer.

10. The FET structure of claim 9,
wherein the first FET further comprises a first fin element and the first gate structure wraps over the first fin element,
wherein the second FET further comprises a second fin element and the second gate structure wraps over the second fin element.

11. The FET structure of claim 10,
wherein the first FET further comprises a third fin element and the first gate structure wraps over the first fin element and the third fin element,
wherein the second FET further comprises a fourth fin element and the second gate structure wraps over the second fin element and the fourth fin element.

12. The FET structure of claim 9, further comprising:
a shallow trench isolation feature disposed below the gate cut feature.

13. The FET structure of claim 12, wherein the semiconductor nitride layer is spaced apart from the shallow trench isolation feature by the semiconductor oxide layer.

14. The FET structure of claim 12, wherein the portion of the source/drain contact extends into the shallow trench isolation feature.

15. The FET structure of claim 9,
wherein the semiconductor nitride layer comprises silicon nitride,
wherein the semiconductor oxide layer comprises silicon oxide.

16. A semiconductor structure, comprising:
a gate cut feature in direct contact with and extending continuously between an end of a first gate structure of a first field effect transistor (FET) and an end of a second gate structure of a second FET,
wherein the first gate structure comprises a first gate dielectric layer and a first gate electrode layer,
wherein the second gate structure comprises a second gate dielectric layer and a second gate electrode layer,
wherein the gate cut feature comprises a semiconductor nitride layer contacting the first gate electrode layer and the second gate electrode layer and a semiconductor oxide layer spaced apart from the end of the first gate electrode layer and the end of the second gate electrode layer by the semiconductor nitride layer,
wherein the semiconductor oxide layer of the gate cut feature is in direct contact with an end sidewall of the first gate dielectric layer and an end sidewall of the second gate dielectric layer,
wherein the first gate electrode layer and the second gate electrode layer comprise metals, metal nitrides, metal carbide nitrides, or metal silicide nitrides.

17. The semiconductor structure of claim 16,
wherein the first FET further comprises a first fin element and the first gate structure wraps over the first fin element,
wherein the second FET further comprises a second fin element and the second gate structure wraps over the second fin element.

18. The semiconductor structure of claim 16, further comprising:
a source/drain contact disposed over and electrically coupled to a first source/drain feature of the first FET and a second source/drain feature of the second FET, wherein a portion of the source/drain contact extends between the first source/drain feature and the second source/drain feature.

19. The semiconductor structure of claim 18,
wherein the source/drain contact comprises silicide layer in direct contact with the first source/drain feature and the second source/drain feature and a metal layer disposed over the silicide layer,
wherein the metal layer comprises titanium (Ti), nickel (Ni), cobalt (Co), tantalum (Ta), erbium (Er), yttrium (Y), ytterbium (Yb), platinum (Pt), or combinations thereof.

20. The semiconductor structure of claim 18, further comprising:
a shallow trench isolation feature disposed below the gate cut feature,
wherein the portion of the source/drain contact partially extends into the shallow trench isolation feature.

* * * * *